US007757395B2

(12) United States Patent
Watanabe

(10) Patent No.: US 7,757,395 B2
(45) Date of Patent: Jul. 20, 2010

(54) METHOD OF MANUFACTURING SUBSTRATES WITH FEEDTHROUGH ELECTRODES FOR INKJET HEADS AND METHOD OF MANUFACTURING INKJET HEADS

(75) Inventor: Hideo Watanabe, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 637 days.

(21) Appl. No.: 11/374,951

(22) Filed: Mar. 14, 2006

(65) Prior Publication Data

US 2006/0213955 A1 Sep. 28, 2006

(30) Foreign Application Priority Data

Mar. 22, 2005 (JP) ............................. 2005-082602
Oct. 13, 2005 (JP) ............................. 2005-299425

(51) Int. Cl.

*H01K 3/10* (2006.01)
*H01R 12/04* (2006.01)
*H05K 1/11* (2006.01)
*B41J 2/14* (2006.01)
*B41J 2/16* (2006.01)
*B23P 17/00* (2006.01)

(52) U.S. Cl. ......................... 29/852; 174/262; 174/266; 347/50; 29/417

(58) Field of Classification Search .................. 29/825, 29/846, 890.1, 852, 412, 417; 347/50, 57
See application file for complete search history.

(56) References Cited

U.S. PATENT DOCUMENTS 4,616,408 A * 10/1986 Lloyd .......................... 29/611
7,100,415 B2 * 9/2006 Takashima et al. ............ 72/335
7,197,799 B2 * 4/2007 Higuchi et al. ............. 29/25.35
7,334,335 B2 * 2/2008 Shin et al. .................. 29/890.1
7,478,476 B2 * 1/2009 Kawamura ................. 29/890.1

* cited by examiner

*Primary Examiner*—A. Dexter Tugbang
*Assistant Examiner*—David P Angwin
(74) *Attorney, Agent, or Firm*—Lucas & Mercanti, LLP

(57) ABSTRACT

A method of producing substrate 3 having feedthrough electrodes for an inkjet head, including: a step of forming grooves in the substrate 1 in the same pitch as that of the inkjet head; a step of setting conductive member 101 in the grooves; a step of adhering covering substrate 2 onto substrate 1; a step of cutting adhered substrate 1 and covering substrate 2 in a direction perpendicular to that of the grooves in a predetermined width.

9 Claims, 16 Drawing Sheets

METHOD OF MANUFACTURING SUBSTRATES WITH FEEDTHROUGH ELECTRODES FOR INKJET HEADS AND METHOD OF MANUFACTURING INKJET HEADS

This application claims priority from Japanese Patent Application No. 2005-299425 filed on Oct. 13, 2005 and No. 2005-082602 filed on Mar. 22, 2005, which are incorporated hereinto by reference.

The present invention relates to a method of manufacturing a substrate having feedthrough electrodes for an inkjet head, and an inkjet head, in particular to a method of manufacturing a substrate for an inkjet head having feedthrough electrodes at a low cost with high reliability without using advanced manufacturing processes, to a method of manufacturing a low cost and highly reliable inkjet head which does not require to lead the electrodes round on a head surface as the electrode can be connected through the back surface of the head, and to a method of manufacturing an inkjet head having three or more arrays of channels.

Conventionally, regarding the method of forming feedthrough electrodes, a method disclosed in Patent Document 1 has been known. In Particular, to begin with, V-shaped grooves are formed in a silicon substrate by anisotropic etching using an etching liquid such as KOH, etc., and next, at the positions of the V-shaped grooves in the silicon substrate, through-holes are formed by an photoexcitation electropolishing-method. Next, the internal walls of the through-holes are oxidized to form an oxide film as an insulating layer. Thereafter, a metal is filled inside the through-holes by a molten metal backfilling method, thereby the feedthrough electrodes is formed in the substrate.

Further, in an inkjet head of the share mode type, a technology of providing feedthrough electrodes so as to electrical contact to a driving electrode formed on inner walls of the channels is disclosed in Patent Document 2.

Patent Document 1: Japanese Unexamined Patent Application Open to Public Inspection No. 2002-237468

Patent Document 2: Japanese Unexamined Patent Application Open to Public Inspection No. 2002-103612

However, in the method disclosed in Patent Document 1, in order to form through-holes, it is necessary to have two processes which are forming V-shaped grooves by anisotropic etching and forming through-holes using an optically excited electrolytic grinding method. Also advanced manufacturing processes such as anisotropic etching and photoexcitation electropolishing method are necessary, and hence there was a problem of increasing the manufacturing cost.

Further, in Patent Document 2, a method of forming feedthrough electrodes by inlaying or injecting a conductive material made of silver or silver-palladium alloy inside the through-hole is disclosed, however the method of preparing the through-holes is not disclosed.

SUMMARY OF THE INVENTION

Therefore, an object of the present invention is to provide a method of manufacturing a substrate having feedthrough electrodes for inkjet heads at low cost with high reliability without using advanced manufacturing processes.

Further, another object of the present invention is to provide a method of manufacturing a low cost and highly reliable inkjet head without leading the electrodes round on the surface of the head by having a direct contact with the electrodes inside the grooves from the back surface of the substrate.

The above problems are solved by each of the following methods.

1) A method of producing a substrate having feedthrough electrodes for an inkjet head, including: a step of forming grooves in the substrate in the same pitch as that of the inkjet head; a step of setting a conductive member in the grooves; a step of adhering a covering substrate onto the substrate; a step of cutting the adhered substrate and the covering substrate in a direction perpendicular to that of the grooves in a predetermined width.

2) A method of producing a substrate having feedthrough electrodes for an inkjet head of item 1, wherein in the step to form the grooves, adjacent grooves belong to different channel groups and the grooves in each group are formed to be different from the grooves in the other groups in a depth.

3) A method of producing a substrate having feedthrough electrodes for an inkjet head, including; a step of forming grooves in the substrate; a step of setting a conductive member in the grooves; a step of adhering two substrates respectively having conductive electrodes in the grooves so that surfaces where the grooves are formed face each other. a step of cutting two adhered substrates, which have the conductive electrodes respectively, in a direction perpendicular to that of the grooves in a predetermined width.

4) A method for producing a substrate having feedthrough electrodes for an inkjet head of item 3, wherein in the step of forming the grooves in the substrate, the grooves of the substrate are formed in the same pitch as the channels of the inkjet head, and in the step of adhering each substrate, the grooves in each substrate correspond each other.

5) A method for producing a substrate having feedthrough electrodes for an inkjet head of item 3, wherein in the step of forming the grooves in the substrate, the grooves of the substrate are formed in a pitch which is two times pitch of channels of the inkjet head, and in the step of adhering each substrate, the substrates are adhered so that the grooves in each substrate appear on the adhering surface alternately.

6) A method for producing a substrate having feedthrough electrodes for an inkjet head of item 1, wherein the conductive member is made of a metal wire.

7) A method of for producing a substrate having feedthrough electrodes for an inkjet head of item 6, wherein the relationship between a diameter A of the metal wire and a width a of the channel is $A \leqq a$.

8) A method for producing a substrate having feedthrough electrodes for an inkjet head of item 1, wherein the conductive member is formed by a conductive paste.

9) A method for producing a substrate having feedthrough electrodes for an inkjet head of item 1, wherein the conductive member is formed by electroplating.

10) A method for producing a substrate having feedthrough electrodes for an inkjet head of item 1, wherein after forming the substrate having the feedthrough electrodes, bumps are formed on either both surfaces or one surface of the electrodes by electroplating.

11) A method for producing a substrate having feedthrough electrodes for an inkjet head of item 1, wherein after forming a substrate having the feedthrough electrodes, either both surfaces or one surface of the electrodes is recessed by etching so that the surfaces of the electrodes are lower than that of the substrate.

12) A method for producing a substrate having feedthrough electrodes for an inkjet head of item 1, wherein after forming the substrate having the feedthrough electrodes, wires connected with the electrodes is formed.

13) A method for producing an inkjet head, including; a step of adhering two substrates composed of two piezoelectric material which are adhered each other in opposite direction of polarization, with the substrate produced by the method of item 1, a step of forming the grooves on the substrate made of two adhered piezoelectric material in each position where the electrodes correspond, and forming driving walls and the grooves alternatively; a step of forming driving electrodes on a surface of the driving walls.

14) A method for producing an inkjet head of item 13, wherein the method for forming the grooves on the substrate is the same as that for forming the channels on the inkjet head.

15) A method for producing an inkjet head, including; a step of connecting the substrate produced by the method of item 1, with a driving electrode, wherein the substrate is used as a wiring electrode and the driving electrodes drive the driving wall located inside the inkjet head having more than three arrays of grooves.

DESCRIPTION OF THE PREFERRED EMBODIMENT

Some preferred embodiments of the present invention are described in the following.

First Preferred Embodiment of Substrate with Feedthrough Electrodes for Inkjet Heads The first preferred embodiment of the method of manufacturing a substrate having feedthrough electrodes for inkjet heads according to the present invention includes a first step of forming grooves in the substrate with the same pitch as that of the channels of the inkjet head, a second step of providing conductive members in the grooves, a third step of adhering a covering substrate to the substrate, and a fourth step of cutting the adhered substrate and covering substrate in a prescribed width along a direction perpendicular to the grooves.

(First Step)

Figure 1:
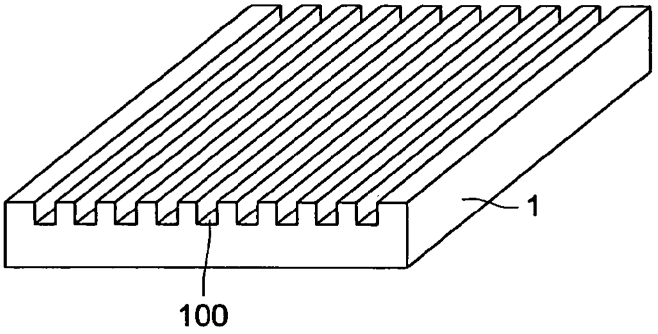
FIG. 1 is a perspective view for explaining the first step of the first preferred embodiment.

FIG. 1 is a perspective view for explaining the first step, and in this step, as shown in this figure, grooves 100 are formed in substrate 1 with the same pitch as the channels of an unillustrated inkjet head (to be described later).

The shape of substrate 1 is determined to correspond to the shape of the inkjet head, and, for example, it is possible to form it with the dimensions of 48 mm (width)×68 mm (length)×5 mm (thickness).

Further, for the material of substrate 1, it is possible to use a ceramic material such as non-polarized PZT, AlN—BN, AlN, plastic or glass having a low thermal expansion coefficient.

Further, it is also possible to use the same substrate material as the substrate material of the piezoelectric material used in the inkjet head after depolarization, and also, in order to suppress the generation of distortion of the head due to the difference in the thermal expansion coefficient, it is still more desirable to select the material so that the difference of the thermal expansion coefficient from that of the head is within the range of ±2 ppm/° C.

In order to form grooves 100, from the point of view of ease of the machining operations and reducing of the machining cost, it is desirable to use a dicing saw (an apparatus which machines grooves on the work piece by a very thin external periphery blade affixed to the tip of a spindle that rotates at a high speed).

By moving the dicing saw from one edge of substrate 1 to the other edge to machining each groove 100, it is possible to form a plurality of grooves in parallel with a straight shape. All the grooves are formed so that all of them have effectively the same depth.

Grooves 100 are formed to have the same pitch as that of the channels of the inkjet head, for example of the form of grooves 100, it is possible to have 256 grooves with a width of 50 μm, depth of 50 μm, and pitch of 141 μm.

(Second Step)

Figure 2:
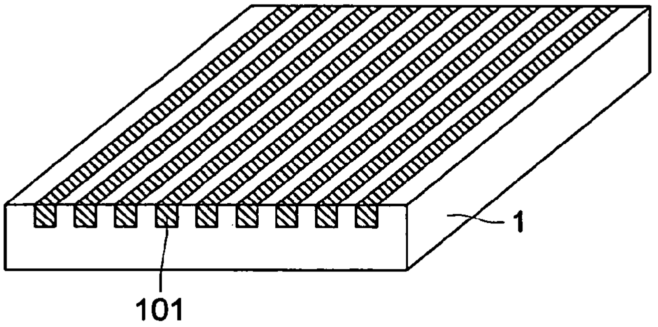
FIG. 2 is a perspective view for explaining the second step of the first preferred embodiment.

FIG. 2 is a perspective view for explaining the second step, and in this step, conductive members 101 are provided in grooves 100 formed in the first step.

The method of providing the conductive member 101, which are not restricting, as a first preferable embodiment, can be fixing a metal wire inside grooves 100. When a metal wire is used, by providing a material that fills the gap between the metal wire and grooves 100, the metal wire can be laid inside grooves 100. The material to fill the gap between the metal wire and groove 100 can be an adhesive which not only fixes by adhering the metal wire inside groove 100 but also fills the gap between the metal wire and grooves 100.

Although it is possible to consider wires of gold, silver, copper or nickel, etc. as the metal wire, gold is the most desirable among them because of its excellent conductivity and chemical stability.

Figure 3:
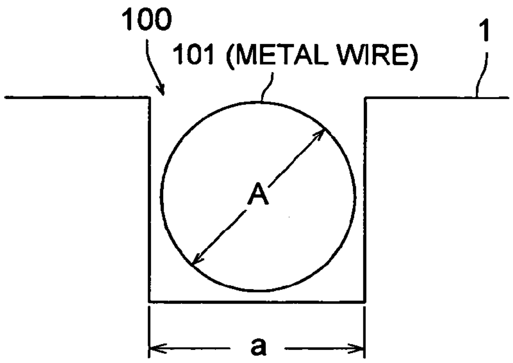
FIG. 3 is an explanatory explaining the relationship between the grooves and the metal wires.

When using a metal wire as the conductive member 101, as shown in FIG. 3, being giving that the diameter of the metal wire is A and the width of grooves 100 is a, it is desirable that they satisfy the relationship of $A \leqq a$. For example, when the width of grooves 100 is 50 μm, the diameter of the metal wire should be not more than 50 μm, and can be, for example, 38 μm.

It is possible to use metal wires with a diameter of 20 to 100 μm so as to be within a range that satisfies the above relationship with the width 'a' of grooves 100.

A second preferable embodiment is one in which the conductive member 101 is formed using a conductive paste made of gold, silver, or copper. A conductive paste is formed by using a standard method, for example, it is formed by thoroughly mixing metal particles of gold, silver, or copper or shreds of metal films with a binder. The ratio of metal particles or shreds of metal films to the binder can be one that ensures sufficient contact between metal particles or between shreds of metal films. It is possible to lay the conductive member 101 in grooves 100 by a simple method such as applying the conductive paste using a brush, etc.

Further, it is possible to lay conductive material 101 inside of grooves 100 by extruding conductive paste using an inkjet head having the same number and the same pitch of nozzles as the grooves 100.

Figure 4:
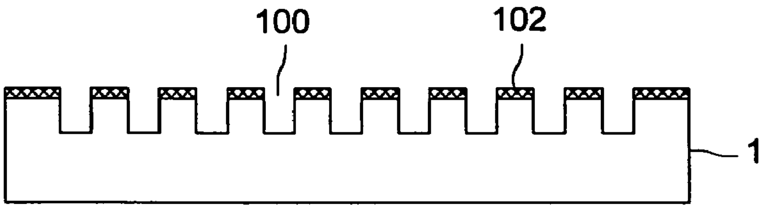
FIG. 4 is a front view explaining the method of forming feedthrough electrodes by electroplating.

In addition, in a third preferable embodiment, the conductive member 101 is formed by electroplating. In other words, a photoresist is coated on the substrate 1, thereafter, in similar process to the first step, grooves 100 are formed as shown in FIG. 1 by an unillustrated dicing saw. As a result, as shown in FIG. 4, photoresist 102 is formed over all the surfaces of parts other than grooves 100.

Next, selective electroplating that does not plate on top of photoresist 102 is made to grow, for example, NiP inside grooves 100. After electroplating, photoresist 102 is removed, thereby substrate 1 having plated film 103 formed inside grooves 100 is obtained (see FIG. 5). This plated film 103 eventually becomes the feedthrough electrode. As the plating material, the materials that can be plated by normal plating such as gold, nickel, copper, etc. can be used.

Figure 5:
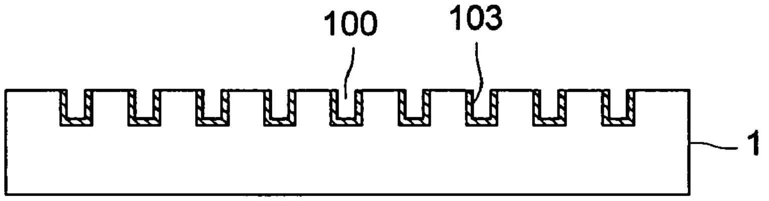
FIG. 5 is a front view explaining the method of forming feedthrough electrodes by electroplating.

In FIG. 5, while plating film 103 are formed on the surface inside grooves 100, it is possible to make the plating thick in order to fill up grooves 100. As described later, it is desirable to form bumps by electroplating rather than inlaying the material. Meanwhile, when feedthrough electrode 101 is solely referred, feedthrough electrode 101 includes feedthrough electrodes formed by plated film 103 besides feedthrough electrodes formed by metal wire and feedthrough electrodes formed by conductive paste.

(Third Step)

Figure 6:
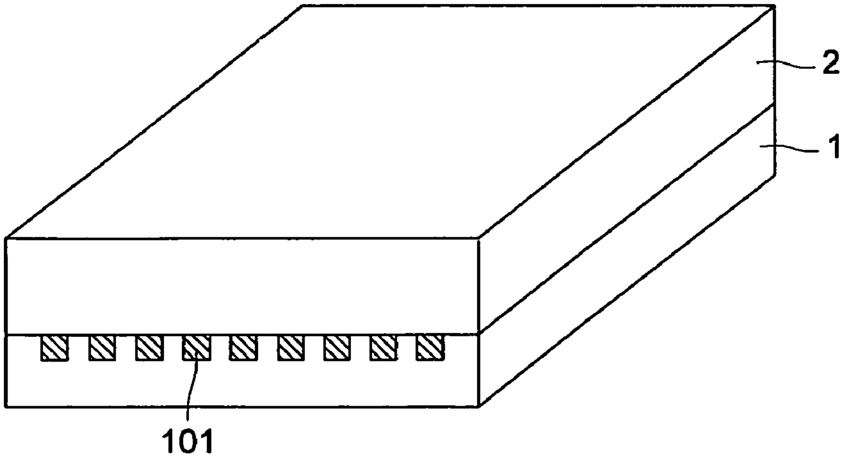
FIG. 6 is a perspective view for explaining the third step of the first preferred embodiment.

FIG. 6 is a perspective view for explaining the third step, and in this step, covering substrate 2 is adhered to substrate 1. It is desirable that covering substrate 2 is made in the same size and by the same material as substrate 1, from the view point of preventing distortion. Covering substrate 2 is used in its flat shape as it is without forming grooves 100. The method of adhering is not restricted, and it is possible to use ordinarily methods, for example, a method of bonding by using an epoxy type adhesive.

When a metal wire is used as conductive member 101, it is desirable that the same adhesive is used to lay the wire in grooves 100 and to adhere covering substrate 2 at the same time. Thereby, the metal wire will be fixed and adhered inside grooves 100.

(Fourth Step)

Figure 7:
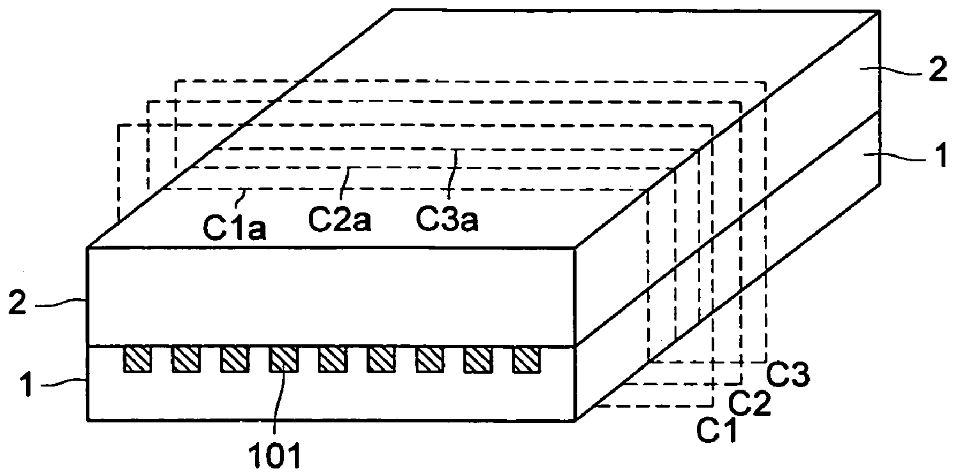
FIG. 7 is a perspective view for explaining the fourth step of the first preferred embodiment.

FIG. 7 is a perspective view for explaining the fourth step, and in this step, adhered substrate 1 and covering substrate 2 are cut in a prescribed width by cutting planes of C1, C2, and C3 in a direction perpendicular to grooves 100. C1*a*, C2*a*, and C3*a* in this figure are the cutting lines of substrate 1 and covering substrate 2 which are cut along the cutting planes C1, C2, and C3.

The cutting planes are not restricted to C1, C2, and C3 as shown in the figure, and it is possible to cut in four or more cutting planes.

The pitch between C1, C2, C3, . . . is not particularly restricted as long as they form thin plates, for example, it is possible to make the pitch 1 mm between the cutting planes.

By such cutting in a plural number of cutting planes, it is possible to manufacture a plurality of substrates 3 having feedthrough electrodes for inkjet heads as is shown in FIG. 8(A) in which the conductive member 101 becomes the feedthrough electrode.

As the cutting means, it is possible to use, for example, a multiple wire saw, and it is desirable to lap and polish the cut surfaces after cutting.

There is given one example of the shape of substrate 3 having feedthrough electrodes shown in FIG. 8(A), the embodiment after carrying out, for example, lapping and polishing can have dimensions of, for example, 48 mm (width)×10 mm (length)×0.8 mm (thickness).

Figure 8:
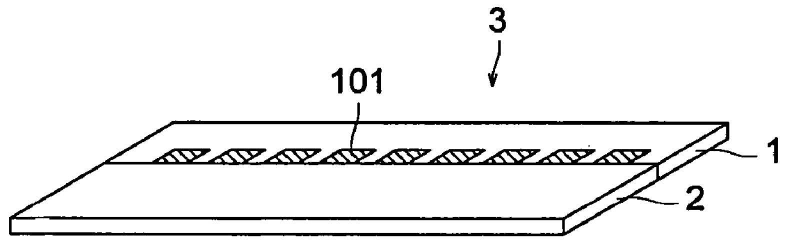
FIG. 8(A) is a perspective view showing a substrate having feedthrough electrodes according to the first preferred embodiment.
FIG. 8(B) is a perspective view showing a substrate having feedthrough electrodes having a plurality of arrays of feedthrough electrodes.
Figure 8:
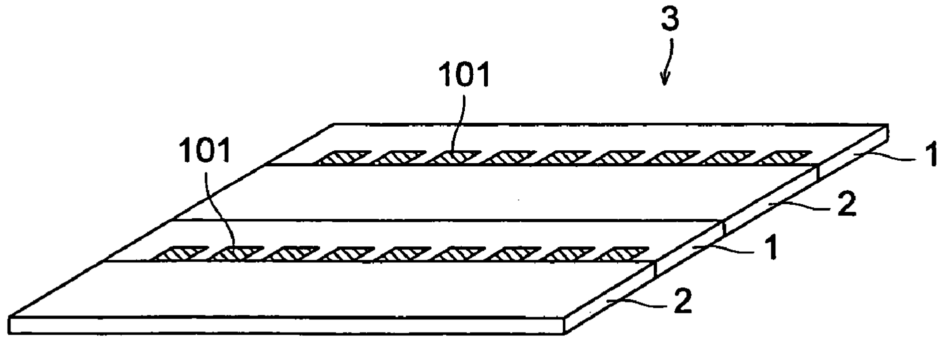

In addition, when a plural number of arrays of feedthrough electrodes 101 are required, adhered substrate 1 and covering substrate 2 as well as other unillustrated adhered substrate 1 and covering substrate 2 are piled up and cut in the same manner thereby, a plurality of substrate 3 having two arrays of feedthrough electrodes 101 shown in FIG. 8(*b*) can be manufactured.

In a similar manner, it is further possible to manufacture a plural number of substrates 3 having feedthrough electrodes for inkjet heads wherein three or more arrays of feedthrough electrodes 101 formed in the substrates.

Second Preferred Embodiment of Substrate with Feedthrough Electrodes for Inkjet Heads (First Step)

While in the first preferred embodiment, in the first step of forming grooves 100 in substrate 1, grooves 100 were formed in substrate 1 where all grooves have effectively the same depth, in the second preferred embodiment, in the first step of forming grooves 100 in substrate 1 in the first preferred embodiment described above, grooves are grouped so that adjacent grooves belong to different groups of groove, and the grooves belong to a particular group have the same depth which is different from the depth of the grooves belong to other groups. Because of this, grooves are formed in substrate 1 so that relatively shallow grooves and deep grooves are arranged side by side alternatively.

Figure 9:
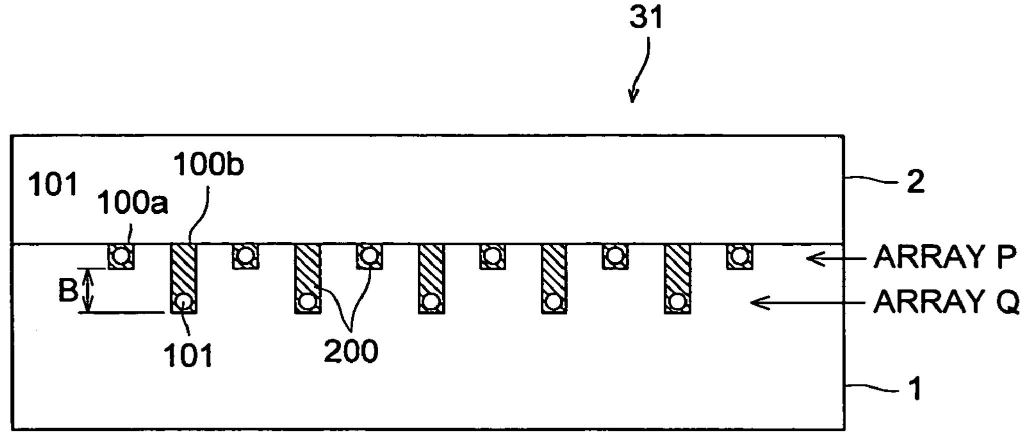
FIG. 9 is a plan view showing a substrate having feedthrough electrodes according to the second preferred embodiment.

FIG. 9 is a plan view showing substrate 31 having feedthrough electrodes manufactured according to the second preferred embodiment.

In substrate 1, relatively shallow grooves 100*a* and deep groves 100*b* are formed so that they are laid alternatively in the same pitch as that of the channels of the inkjet head, and are grouped into two groups which are a group of relatively shallow grooves 100*a* and a group of deep groves 100*b*. For the method of forming the grooves 100*a* and 100*b*, the method described in the first preferred embodiment can be employed, except that the depth is made different.

(Second Step)

In the second step, conductive members 101 are provided in grooves 100*a* and 100*b* formed in substrate 1 in the same manner as the second step in the first preferred embodiment.

While any of metal wires, conductive paste, or electroplating given as desirable examples in the first preferred embodiment can be used for the conductive member 101 provided inside each of grooves 100*a* and 100*b*, it is desirable to use metal wires among them. After laying the metal wire at the bottom part in grooves 100*a* and 100*b* as shown in the figure, it is fixed by using an insulating adhesive material 200. With this adhesive material 200, it is desirable to adhere the metal wire and to fill the gap between the metal wire and grooves 100*a* and 100*b* at the same time.

By using a metal wire as the conductive member in this manner, it is possible to enlarge the distance between the metal wire in relatively shallow grooves 100*a* and the metal wire in deep grooves 100*b*. In particular, being given that the diameter of the metal wire is A, and the difference between the depths of the shallow grooves 100*a* and deep grooves 100*b* is B (see FIG. 9), by setting the depths of grooves 100*a* and 100*b* and the diameter of the metal wire so that the relationship between A and B is A<B, and being given that the array of metal wires in shallow grooves 100*a* is array P and the array of metal wires in deep grooves 100*b* is array Q, when array P and array Q are seen from the direction of the array, it is possible to form a non-conductive region between the conductive member 101 of array P and the conductive member 101 of array Q.

Thereafter, as explained in the first preferred embodiment, after fixing covering substrate 2 (the third step), by cutting into thin plates (the fourth step), it is possible to manufacture a plurality of substrates 31 having feedthrough electrodes in which conductive member 101 (the metal wire) becomes the feedthrough electrode.

Even in this second preferred embodiment, in the same manner shown in FIG. 8(B), it is possible to manufacture a plurality of substrates 31 having feedthrough electrodes for inkjet heads in which a plural number of layers of feedthrough electrodes 101 are formed.

Third Preferred Embodiment of Substrate having Feedthrough Electrodes for Inkjet Heads The third preferred embodiment of the method of manufacturing substrates having feedthrough electrodes for inkjet heads according to the present invention includes a first step of forming grooves in the substrate, a second step of providing conductive members in the grooves, a third step of adhering two substrates in which conductive members are provided respectively so that the surfaces where the grooves are formed face each other, and a fourth step of cutting adhered two substrates in a prescribed width along cutting planes that are perpendicular to the grooves.

Description of the first step and the second step will be omitted here because it is possible to use the same methods as those of the first and second step of the first preferred embodiment described above.

(Third Step)

Figure 10:
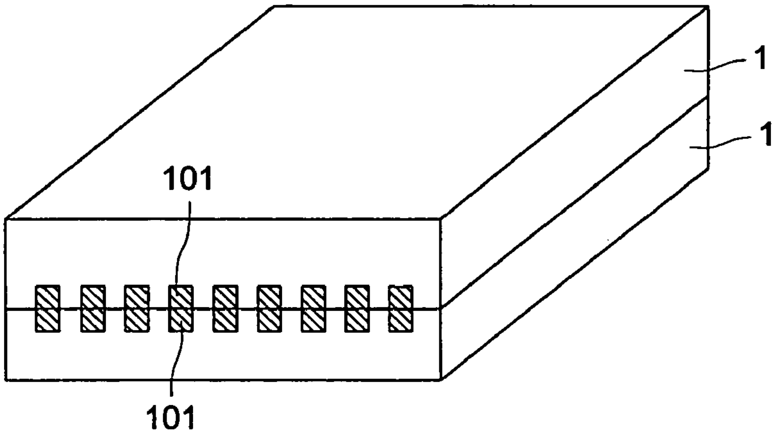
FIG. 10 is a perspective view for explaining the third step of the third preferred embodiment.

FIG. 10 is a perspective view for explaining the third step, and in this step, two substrates 1 and 1 in which conductive members 101 are provided in grooves 100 which are formed in the same pitch as that of the channels of the inkjet head, are adhered each other so that the surfaces of the substrates 1 and 1 in which grooves 100 are formed, face each other. Here, the substrates 1 and 1 are adhered so that the positions of grooves 100 in the two substrates match each other. Although it is possible to use ordinarily the method of adhering, for example, an epoxy type adhesive material as the method of adhering, in this form, the method of adhering is not limited as long as the conductive members 101 in grooves 100 of substrates 1 and 1 whose position is matched are electrically connected.

As described in the first preferred embodiment, it is possible to provide conductive member 101 by using metal wires, conductive paste, or electroplating.

In this manner, since two substrates 1 and 1 in which conductive members 101 are provided in respective grooves 100 are adhered each other so that the positions of the grooves are matched in the two substrates, compared to the method explained in the first preferred embodiment described above, if the width and depth of groove 100 in each of two substrates 1 and 1 are made the same, it is possible to double the area of feedthrough electrode 101 obtained. In other words, if, for example, groove 100 of one substrate 1 has a width of 50 μm and a depth of 50 μm, the size of the exposed surface of the feedthrough electrode finally obtained will be a maximum of 50 μm×50 μm in the first preferred embodiment and will be 50 μm×100 μm in the present preferred embodiment.

Further, when the area of feedthrough electrode 101 obtained is made equal to that of the feedthrough electrode obtained by the first preferred embodiment, it is possible to halve the depth of groove 100 in one substrate. In other words, if the size of the exposed surface of the feedthrough electrode 101 finally obtained is 50 μm×50 μm, while grooves 100 in one substrate 1 in the case of the first preferred embodiment had a width of 50 μm and a depth of 50 μm, in the present preferred embodiment, it is sufficient to form grooves 100 in one substrate 1 with a width of 50 μm and a depth of 25 μm.

Therefore, in this case, since it is possible to form shallow grooves 100 in one substrate 1, lesser machining time is required for forming grooves 100 in each substrate 1. Further, when conductive members 101 in grooves 100 are formed by conductive paste or electroplating, because grooves 100 become shallow, it becomes easier to fill the inside of these grooves 100 with conductive paste or electroplating.

Further, since the same two substrates 1 and 1 in which grooves 100 are formed, have only to be adhered each other, it is not necessary to prepare two types of substrates of substrate 1 in which grooves 100 are formed and flat covering substrate 2 in which no grooves 100 are formed as in the case of the first and the second preferred embodiments, and even the management of components becomes easy.

(Fourth Step)

In the fourth step, two adhered substrates 1 and 1 are cut in prescribed widths at vertical cutting planes that are perpendicular to grooves 100. Since the cutting method is the same as in the fourth step in the first preferred embodiment described before, its description will be omitted here.

Figure 11:
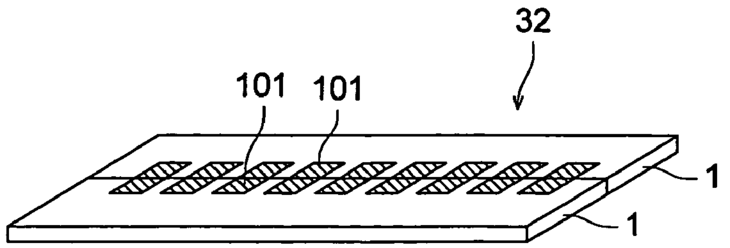
FIG. 11 is a perspective view showing a substrate having feedthrough electrodes according to the third preferred embodiment.

Because of this cutting step, it is possible to manufacture a plurality of substrates 32 having feedthrough electrodes for inkjet heads using the conductive members 101 as the feedthrough electrodes as shown in FIG. 11.

Even in substrates 32 having feedthrough electrodes for inkjet heads described in this third preferred embodiment, in the same manner as shown in FIG. 8(B), it is also possible to form a plurality of arrays of feedthrough electrodes.

Fourth Preferred Embodiment of Substrate having Feedthrough Electrodes for Inkjet Heads Although the fourth preferred embodiment is similar to the third preferred embodiment of the method of manufacturing substrates having feedthrough electrodes for inkjet heads, in an aspect that the fourth preferred embodiment has a first step of forming grooves in the substrate, a second step of providing conductive members in the grooves, a third step of adhering two of substrates in which conductive members are provided so that the surfaces having the grooves formed in them of the two substrates face each other, and a fourth step of cutting adhered two substrates in a prescribed width along vertical cutting planes that are perpendicular to the grooves, it is different from the third preferred embodiment in a point that, in the second step of providing conductive members in the grooves, the conductive members are provided in alternate grooves.

Description of the first step will be omitted here because it is possible to use the same method as that of the first step of the first preferred embodiment described before.

(Second Step)

Figure 12:
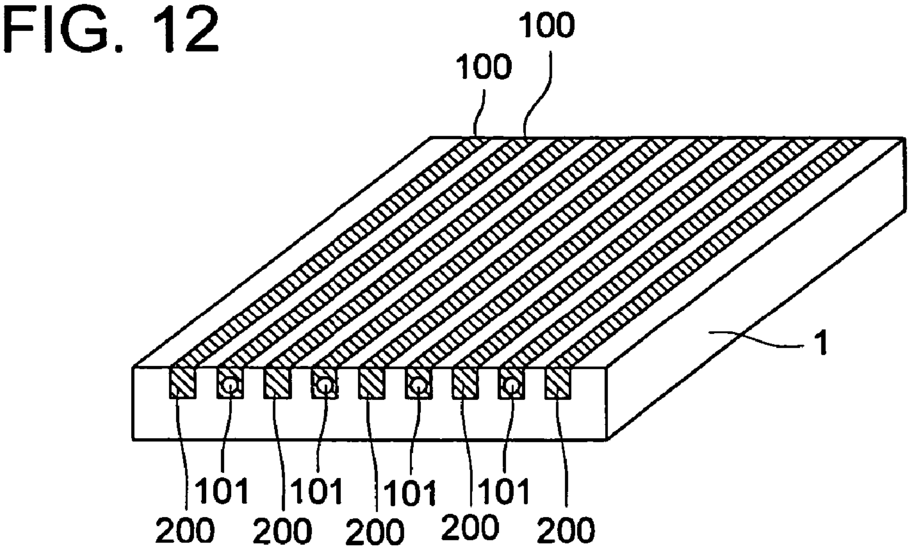
FIG. 12 is a perspective view for explaining the second step of the fourth preferred embodiment.

FIG. 12 is a perspective view of substrate 1 for explaining the second step, and in this step, conductive members 101 are provided in grooves 100 formed to have the same pitch as the channels of the inkjet head. At this time, by providing conductive member 101 in alternate grooves 100, grooves 100 with conductive members 101 and grooves 100 without conductive members 101 are arranged alternately.

Although it is possible to use any of metal wires, conductive paste, or electroplating for providing conductive member 101, as described in the first preferred embodiment, it is desirable to use metal wires among these shown in the figure. After laying the metal wire at the bottom part in alternate grooves 100, it is fixed by using insulating adhesive material 200. By using this adhesive material 200, it is desirable to adhere the metal wire and to fill the gap between the metal wire and grooves 100*a* and 100*b* at the same time.

In grooves 100 in which no conductive member 101 is provided, it is desirable to fill the groove with insulating adhesive material 200 or with some appropriate insulating material.

(Third Step)

In this third step, two of substrates 1 formed in the second step, having conductive members 101 in alternate grooves 100 are prepared, and these substrates 1 and 1 are adhered each other so that their surfaces having grooves 100 face each other. At this time, the substrates are adhered together with an adhesive material after adjusting their positions so that grooves 100 having conductive members 101 correspond to grooves 100 not having conductive member. If an insulating adhesive material is used, it is possible to carry out the work of filling grooves 100 not having conductive materials 101 simultaneously with the work of applying adhesive material for adhering substrates 1 and 1.

Figure 13:
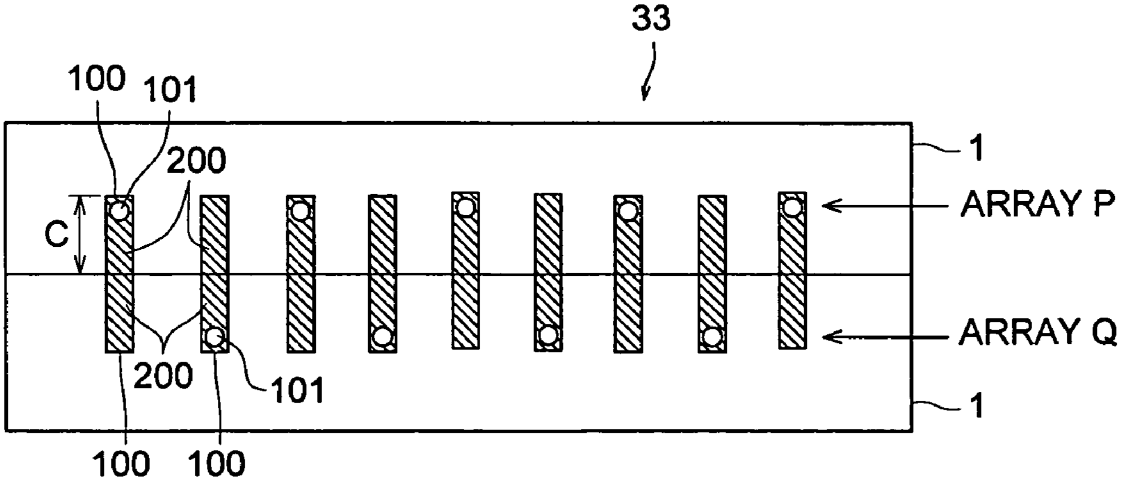
FIG. 13 is a plan view showing a substrate having feedthrough electrodes according to the fourth preferred embodiment.

FIG. 13 is a plan view showing a substrate having feedthrough electrodes manufactured according to the fourth preferred embodiment. Here, when a metal wire is used as conductive member 101, as shown in this figure, it is possible to enlarge the distance between the metal wires in grooves 100 of substrates 1 and 1. In particular, being given that the diameter of the metal wire is A and the depth of grooves 100 of substrates 1 and 1 is C, if the depth of grooves 100 and the diameter of the metal wire are set so that they satisfy the relation ship $A<C$, and being that the array of metal wires in grooves 100 in the upper substrate 1 is array P and the array of metal wires in grooves 100 in lower substrate 1 is array Q, when array P and array Q are seen from the direction of the array, it is possible to form a non-conductive region between conductive member 101 of array P and conductive member 101 of array Q.

Further, even in this preferred embodiment, since the same two substrates 1 and 1 in which grooves 100 are formed have only to be adhered, it is not necessary to prepare two types of substrates which are a substrate 1 in which grooves 100 are formed and a flat covering substrate 2 in which no grooves 100 are as in the case of the first and the second preferred embodiments, and even the management of components becomes easy.

(Fourth Step)

After matching their positions and adhering substrates 1 and 1, as explained in the first preferred embodiment, by cutting the adhered substrates into thin plates, it is possible to manufacture a plurality of substrates 33 having feedthrough electrodes for inkjet heads by using conductive members 101 as the feedthrough electrodes.

Even in this fourth preferred embodiment, in the same manner as shown in FIG. 8(B), it is possible to manufacture a plurality of substrates 33 having feedthrough electrodes for inkjet heads in which a plurality of arrays of feedthrough electrodes 101 are formed.

Fifth Preferred Embodiment of Substrate having Feedthrough Electrodes for Inkjet Heads Although the fifth preferred embodiment of the method of manufacturing substrates having feedthrough electrodes for inkjet heads of the present invention is similar to the aforesaid third and fourth preferred embodiments in an aspect that it includes a first step of forming grooves in the substrate, a second step of providing conductive members in the grooves, a third step of adhering two of the substrates in which conductive members are adhered so that the surfaces where the grooves formed face each other, and a fourth step of cutting the adhered two substrates in a prescribed width along vertical cutting planes that are perpendicular to the grooves, it is different from the third and the fourth preferred embodiments in aspect where in the first step of forming grooves in the substrate, the grooves are formed in a pitch which is twice that of the channels of the inkjet head, and in the third step of adhering the substrates, the substrates are adhered so that the grooves of each substrate appear on the adhering surface alternatively. The first and the third steps which are different from the previous preferred embodiments are described below.

(First Step)

Figure 14:
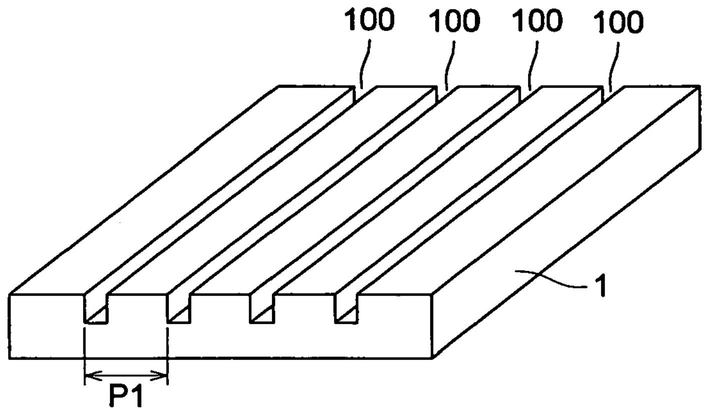
FIG. 14 is a perspective view for explaining the first step of the fifth preferred embodiment.

FIG. 14 is a perspective view of substrate 1 for explaining the first step, and in this first step, grooves 100 are formed on one surface of substrate 1 so that the pitch P1 is two times the pitch of the channels of the inkjet head. Apart from the point that pitch P1 becomes twice the pitch of the channels of the inkjet head, this first step is identical to the first step of the first preferred embodiment.

(Third Step)

After conductive members 101 provided in each of grooves 100 in the second step, in the third step, two of substrates 1 having conductive members 101 provided in grooves 100 are taken, and these substrates 1 and 1 are adhered each other so that their surfaces where grooves 100 formed face each other, and also the positions of grooves 100 in two substrates 1 and 1 are adjusted so that they appear on the adhering surface alternatively.

Figure 15:
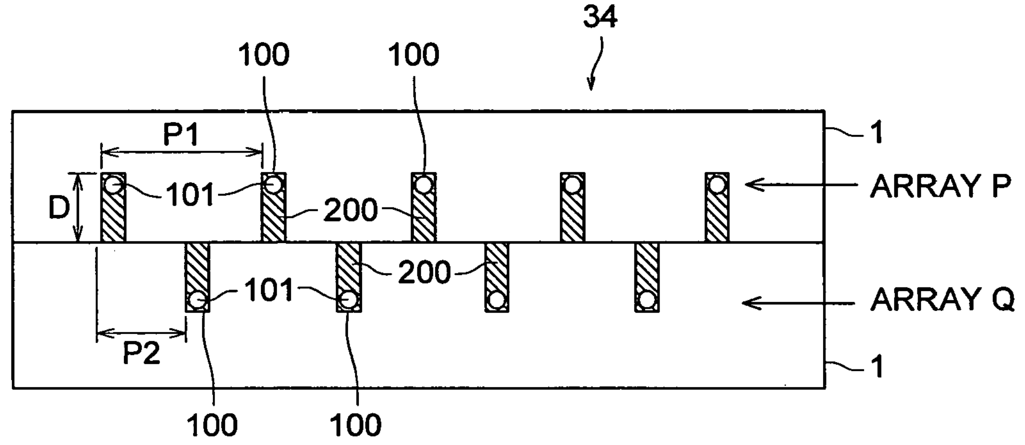
FIG. 15 is a plan view showing a substrate having feedthrough electrodes according to the fifth preferred embodiment.

FIG. 15 is a plan view showing substrate 34 having feedthrough electrodes manufactured according to the fifth preferred embodiment.

Although the grooves are formed so that their pitch P1 on one substrate is twice the pitch of the channels of the inkjet head, at the time of adhering substrates 1 and 1 so that their grooves 100 appear on the adhering surface alternatively, the two substrates are adhered after the positions of the grooves are adjusted so that the pitch P2 between the groove of one substrate and the groove nearest to it on the other substrate is the same as the pitch of the channels of the inkjet head. Therefore, substrate 34 having feedthrough electrodes finally obtained will have feedthrough electrodes 101 at the same pitch as the channels of the inkjet head.

Further, in this fifth preferred embodiment, although it is possible to use any one of metal wires, conductive paste, or electroplating for conductive member 101 provided in grooves 100 of each of substrates 1 and 1, it is desirable to use metal wires among these as described in the first preferred embodiment. After laying the metal wire at the bottom part in each of grooves 100, it is fixed by using an insulating adhesive material 200. By using this adhesive material 200, it is desirable to adhere the metal wire and to fill the gap between the metal wire and grooves 100 at the same time.

When a metal wire is used as conductive member 101, as FIG. 15 shows, it is possible to make the distance between the metal wires in the grooves 100 of substrates 1 and 1 large. In particular, being given that the diameter of the metal wire is A and the depth of grooves 100 of substrates 1 and 1 is D, if the depth of grooves 100 and the diameter of the metal wire are set so that they satisfy the relation ship $A<D$, being given that the array of metal wires in grooves 100 in the upper substrate 1 is array P and the array of metal wires in grooves 100 in lower substrate 1 is array Q, when array P and array Q are seen from the direction of the array, it is possible to form a non-conductive region between conductive member 101 of array P and conductive member 101 of array Q.

Further, even in this preferred embodiment, since the same two substrates 1 and 1, in which grooves 100 are formed, have only to be adhered each other, it is not necessary to prepare two types of substrates of a substrate 1 in which grooves 100 are formed and flat covering substrate 2 in which no grooves 100 are formed as the first and the second preferred embodiments, and even the management of components becomes easy.

After adhering substrates 1 and 1 with adjusting their positions, as explained in the first preferred embodiment, by cutting the adhered substrates into thin plates, it is possible to manufacture a plurality of substrates 34 having the feedthrough electrodes for the inkjet heads by using the conductive members (metal wires) 101 as the feedthrough electrodes.

Also, in the fifth preferred embodiment, in the same manner shown in FIG. 8(B), it is possible to manufacture a plurality of substrates 34 having feedthrough electrodes for the inkjet heads in which a plurality of arrays of feedthrough electrodes 101 are formed.

Furthermore, in each of the preferred embodiments described before, it is desirable to form bumps by electroplating on one side or on both sides of feedthrough electrodes 101 of the obtained substrates 3, 31, 32, 33, or 34 having feedthrough electrodes.

Figure 16:
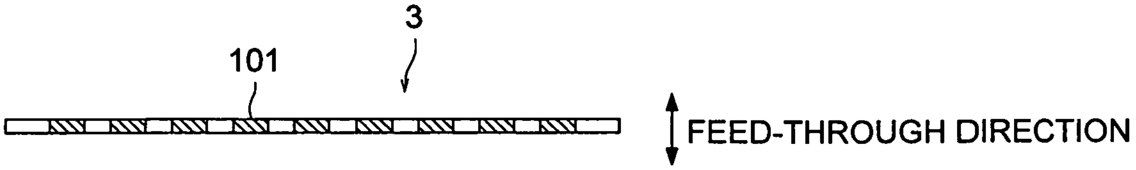
FIG. 16 is a cross-sectional view showing a substrate having feedthrough electrodes obtained in FIG. 8(A).

For example, FIG. 16 shows a cross-sectional view of a substrate having feedthrough electrodes for inkjet heads obtained in FIG. 8(A), and bumps 104 (see FIG. 17) are formed on the feedthrough electrodes 101 exposed on the surface of substrate 3 shown in FIG. 16 by electroless plating or electroplating.

Figure 17:
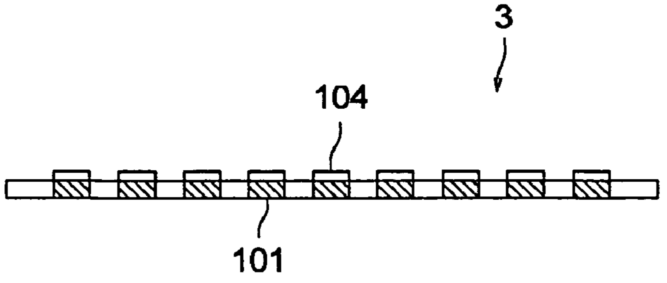
FIG. 17 is a cross-sectional view showing a substrate having feedthrough electrodes on which bumps are formed.
Figure 18:
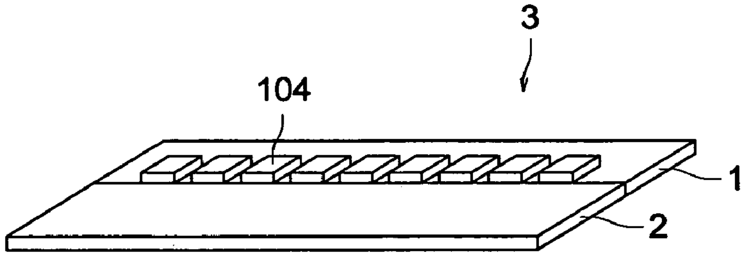
FIG. 18 is a perspective view showing a substrate having feedthrough electrodes on which bumps are formed.

FIG. 17 is a cross-sectional view of a substrate on which bumps are formed, and FIG. 18 is a perspective view of a substrate on which bumps are formed. It is desirable that the height of bumps 104 shown in FIG. 17 is in the range of 10 μm to 100 μm. Although the example shown in the figure is one in which bumps 104 are formed on one side of substrate 3, it is not necessary to be restricted by this example, and it is possible to form bumps on both sides of substrate 3. In addition, even if the step of pattern forming is not carried out, it is also possible to form bumps 104 selectively only on feedthrough electrodes 101 exposed on the surface by the plating method.

Further, an embodiment where a recess is formed by cutting down a front surface, a rear surface or both front and rear surfaces of feedthrough electrode 101 of the obtained substrates 3, 31, 32, 33, or 34 through etching so that the surfaces of feedthrough electrodes are lower than the surfaces of substrates 3, 31, 32, 33 and 34.

Figure 19:
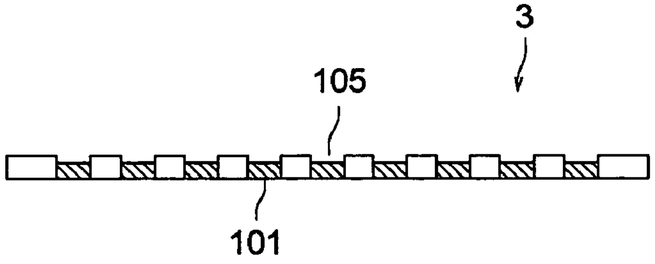
FIG. 19 is a cross-sectional view showing a substrate having feedthrough electrodes having recesses.
Figure 20:
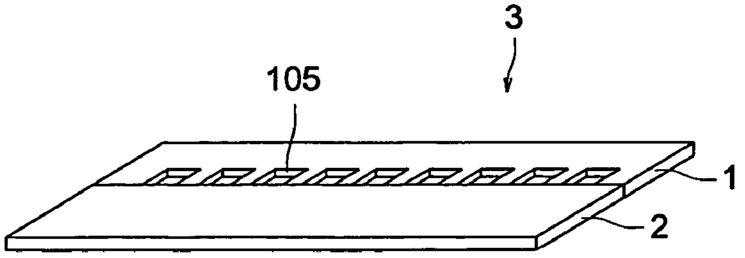
FIG. 20 is a perspective view showing a substrate having feedthrough electrodes shown in FIG. 19.

For example, by etching one surface of feedthrough electrode 101 that is exposed on the surface of substrate 3 shown in FIG. 8(A), a recess 105 is formed by removing 10 μm to 100 μm. As FIG. 19 shows, FIG. 19 is a cross-sectional view of obtained substrate 3 having feedthrough electrodes with the recession. FIG. 20 is a perspective view of FIG. 19.

Further, it is also possible to remove both surfaces of feedthrough electrodes 101 by 10 μm to 100 μm. When cutting down only one surface, it is desirable that a photoresist is coated on the surface which is not to be cut down so that the surface is protected and it is not etched. In addition, it is desirable that the photoresist is removed after etching.

In addition, it is also desirable to have a embodiment in which interconnections in electrical contact with feedthrough electrodes 101 are formed on the surface of the obtained substrates 3, 31, 32, 33, or 34 with the feedthrough electrodes.

Figure 21:
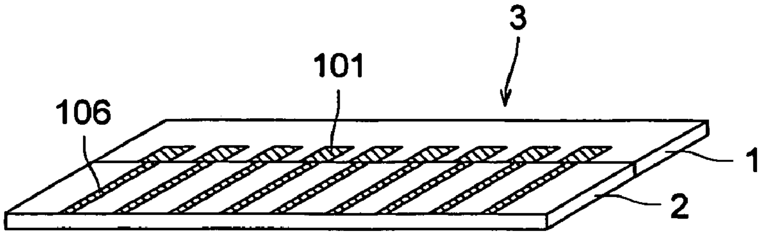
FIG. 21 is a perspective view showing an example in which interconnections are formed on a substrate having feedthrough electrodes.

As shown in FIG. 21, for example, on substrate 3 having feedthrough electrodes, interconnections 106 are formed corresponding to each feedthrough electrode 101. To form interconnections 106, it is possible to use the methods of electroplating, vacuum deposition, sputtering, etc., in which a metal that is superior in electrical conductivity is used. In FIG. 21, the interconnections 106 can also be formed on substrate 1, and they can be formed alternatively on substrate 1 and on covering substrate 2 for neighboring the feedthrough electrodes so that the interconnections are distributed on both sides of the feedthrough electrodes.

<Method of Manufacturing Inkjet Heads>

The method of manufacturing inkjet heads according to the present invention has the feature that the manufacturing is done in the following steps using substrates 3, 31, 32, 33, or 34 having feedthrough electrodes manufactured as described above.

While, explanation is given below for the example of manufacturing using substrate 3 having feedthrough electrodes shown in the first preferred embodiment, it is, of course, also possible to use other substrates 31, 32, 33, or 34 having feedthrough electrodes.

Figure 22:
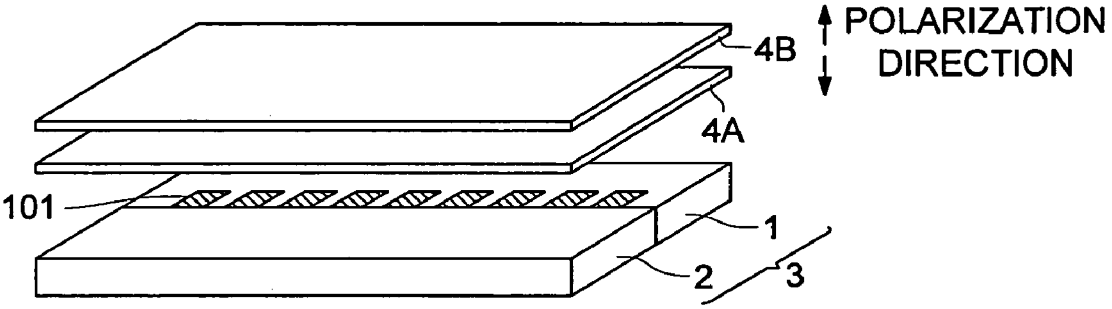
FIG. 22 is a perspective view showing the processes of manufacturing inkjet heads.

Firstly, as is shown in FIG. 22, two substrates 4A and 4B made of a piezoelectric material are adhered to each other so that their directions of polarization are opposite to each other.

As the piezoelectric materials, it is possible to use publicly known piezoelectric materials that distorts when an electric field is applied, and such substrates can be those using an organic material or can be substrates made of non-metallic materials. In particular, it is desirable to use non-metallic piezoelectric materials, and it is possible to use piezoelectric ceramic substrates that are formed using the processes of molding and sintering, or substrates that can be formed without molding and sintering process. As the organic materials used for substrates made of organic materials, organic polymers such as polyfluorovinylidene, hybrid materials of organic polymers and inorganic materials can be used. Among piezoelectric substrates made of non-metallic materials, as the piezoelectric ceramic substrates formed through the processes of molding and sintering, PZT (Lead zirconium titanate) is desirable to use. In addition, it is also possible to use $BaTiO_3$, ZnO, $LiNbO_3$, $LiTaO_3$, etc. PZT can be PZT ($PbZrO_3$—$PbTiO_3$) or third component added PZT. The third component that is added can be $Pb(Mg_{1/3}Nb_{2/3})O_3$, $Pb(Mn_{1/3}Sb_{2/3})O_3$, $Pb(CO_{1/3}Nb_{2/3})O_3$, etc. Further, among non-metallic piezoelectric substrates, the substrates that can be formed without requiring the processes of molding and sintering are, for example, the substrates that can be formed using the sol-gel method, multi-layer substrate coating method, etc.

The piezoelectric substrate 4 is obtained by adhering piezoelectric substrates 4A and 4B. The method of bonding using an adhesive material can be used as the method of adhering, but the method is not restricted to this as long as bonding is possible. When adhesive material is used for bonding, it is desirable that the thickness of the layer of adhesive material after hardening is in the range of 1 to 10 μm.

It is desirable to make the shape of piezoelectric substrate 4 identical to the shape of substrate 3 having feedthrough electrodes, and for example, it is possible to form it with the dimensions of 48 mm (width)×10 mm (length)×0.15 mm (thickness).

Figure 23:
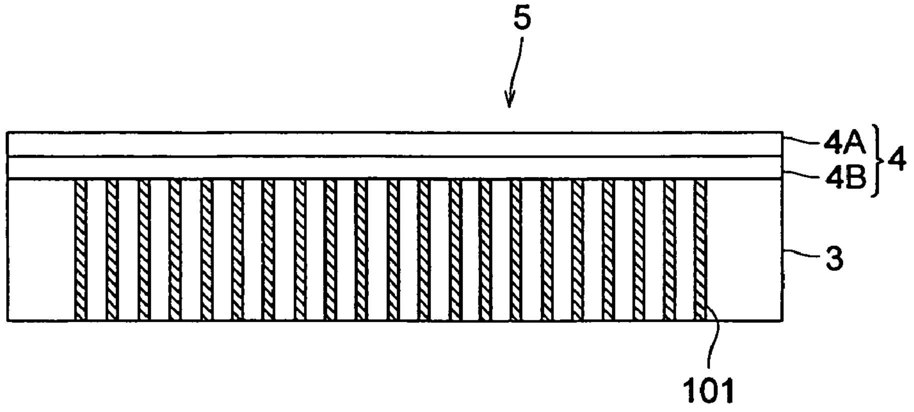
FIG. 23 is a cross-sectional view showing a precursor to substrates for inkjet heads.

By adhering the above piezoelectric substrate 4 to substrate 3 having feedthrough electrodes, substrate precursor 5 for inkjet head shown in FIG. 23. is obtained.

In the above, although the means for adhering the above piezoelectric substrate 4 to substrate 3 having feedthrough electrodes is not particularly restricted, it is possible to use, for example, a method of adhering with an adhesive such as an epoxy resin, etc.

Figure 24:
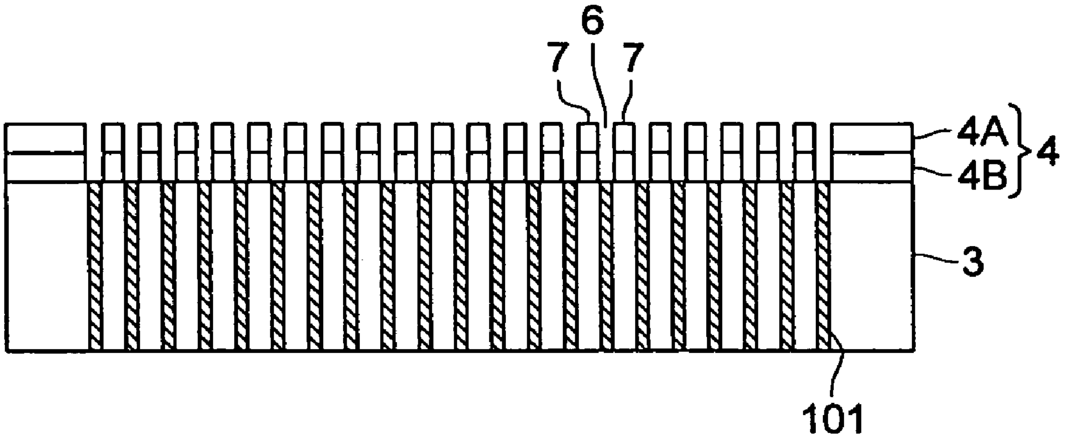
FIG. 24 is a cross-sectional view showing the processes of manufacturing inkjet heads.

Secondly, as shown in FIG. 24, a plurality of channels 6, are formed at positions corresponding to feedthrough electrodes 101 in substrate 4 having two piezoelectric material affixed as above, and a plurality of channels 6 and drive walls 7 are formed alternatively.

In other words, since two piezoelectric substrates 4 are bonded so that their directions of polarization opposite each other as described above, by setting a plurality of arrays of channels 6 in parallel to piezoelectric material so as to correspond to piezoelectric substrates 4, drive walls 7 in which the directions of polarization oppose each other will be formed.

Each channel 6 is formed in parallel with a straight shape from one end of substrate 4 to the other end in almost the same depth.

In order to machine and form channels 6 in this manner, although not specifically restricted, it is desirable to form by using the same dicing saw as that used for forming grooves 100. In other words, since the same machining method is used for grooves 100 and channels 6, it is possible to machine grooves 100 for configuring feedthrough electrodes 101 and channels 6 with a high accuracy in the same pitch, and it is possible to match the positions of the two with a high accuracy.

It is desirable that the depth of the machined channels 6 is about 10 to 50 μm by cutting feedthrough electrodes 101 down, in order to firm the connection.

Figure 25:
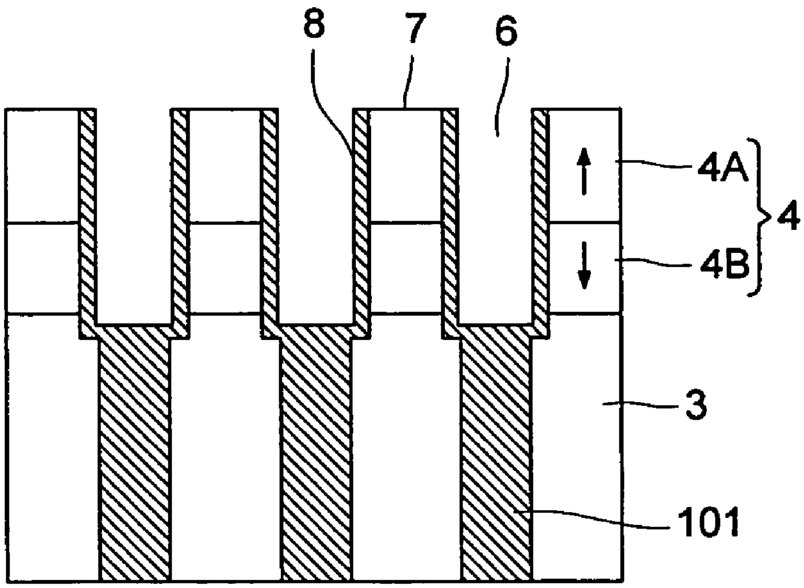
FIG. 25 is an enlarged cross-sectional view of the channel part of FIG. 24.

FIG. 25 is an enlarged cross-sectional view of the channel part of FIG. 24, drive electrodes 8 are provided by using standard techniques on the inner surfaces of drive walls 7. The technique of formation can be, for example, aluminum evaporation or electroplating. By configuring in this manner, drive electrodes 8 can have electrical conductivity with feedthrough electrodes 101.

According to the present invention, it is possible to constitute substrate 3 having feedthrough electrodes and piezoelectric substrate 4 with the same material. When PZT is used as the material for piezoelectric substrate 4, it is possible to use non-polarized PZT as substrate 3 having feedthrough electrodes. By this, it is possible to lessen the difference in the thermal expansion coefficients between the two, and it is possible to avoid distortions or reduction in performance due to thermal expansion. In addition, even at the time of forming channels 6 by using a dicing saw, the cutting characteristics does not change because the same material is used, and it is possible to form the channels in a stable manner.

Figure 26:
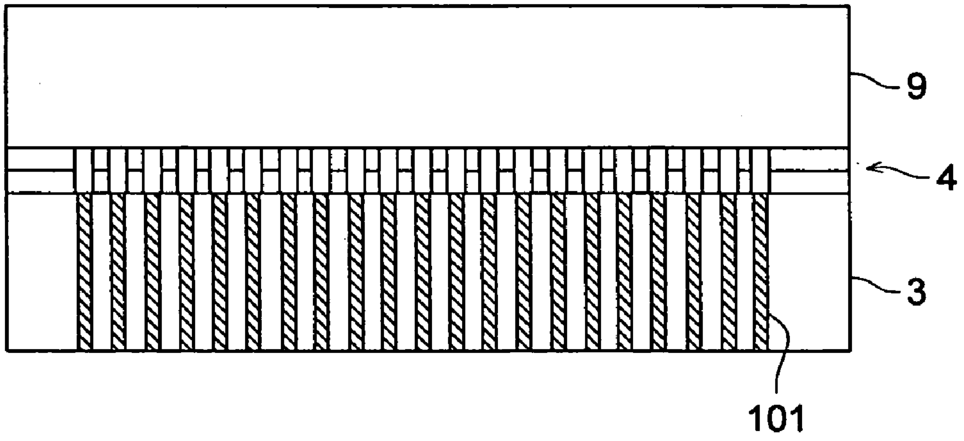
FIG. 26 is a cross-sectional view showing an example in which a covering substrate is adhered on the top surface of a substrate made of two piezoelectric material.

Next, as shown in FIG. 26, covering substrate 9 is adhered on the top of substrate 4 made of two piezoelectric material. Although the method of adhering is not particularly restricted, it is possible to use, for example, a method of adhering by using an adhesive such as an epoxy resin, etc.

It is desirable to use the same material as the piezoelectric material for covering substrate 9 because there is no peeling off at the time of adhering due to warp, deformation, or difference in the thermal expansion coefficients. Further, a non-piezoelectric substrate having the same thermal expansion coefficient as the piezoelectric material can be also used. As the non-piezoelectric substrate, it is possible to use, for example, ceramic substrates that are formed by using the processes of molding and sintering, or substrates that can be formed without the processes of molding and sintering. Also as the ceramic substrates which are formed using the processes of molding and sintering, $Al_2O_3$, $SiO_2$, mixtures and molten mixtures thereof, $ZrO_2$, BeO, AlN, and SiC, can be used. Further, substrates made of organic materials such as organic polymers and hybrid materials which is combination of organic polymers and inorganic materials can be used.

Figure 27:
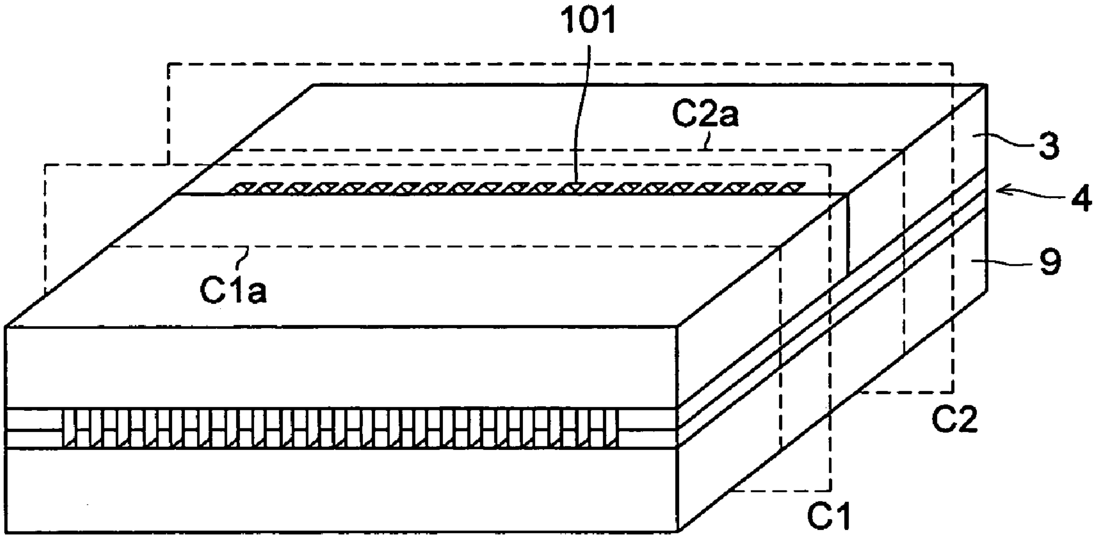
FIG. 27 is a perspective view showing the head having covering substrate shown in FIG. 26 upside down.

Next, the substrates are cut in planes perpendicular to channels 6, thereby harmonica type head chips with a prescribed length is obtained. FIG. 27 is a perspective view showing the head having the covering substrate shown in the figure upside down, and as shown in this figure, the cutting is done at the cutting planes C1 and C2 in a direction perpendicular to channels 6, thereby harmonica type head chips with a prescribed length is obtained. In this figure, C1*a* and C2*a* are the cutting lines on the head having the covering substrate when cut at the cutting planes C1 and C2 in a direction perpendicular to channels 6.

Here, a harmonica type head chip is a head chip in which the cross-sectional shape of the plural number of channels 6, provided in parallel does not practically change in the longitudinal direction, and the inlets and outlets of each of channels 6 are placed to oppose to the rear surface and the front surface of the head chip respectively. In other words, the ink flowing from the inlet of channels 6, flows straight through the inside of channels 6 and is ejected from the nozzle provided at the outlet of channels 6.

Feedthrough electrode 101 enters this cut harmonica type head chip. This embodiment is a middle part by cutting into three segments.

Figure 28:
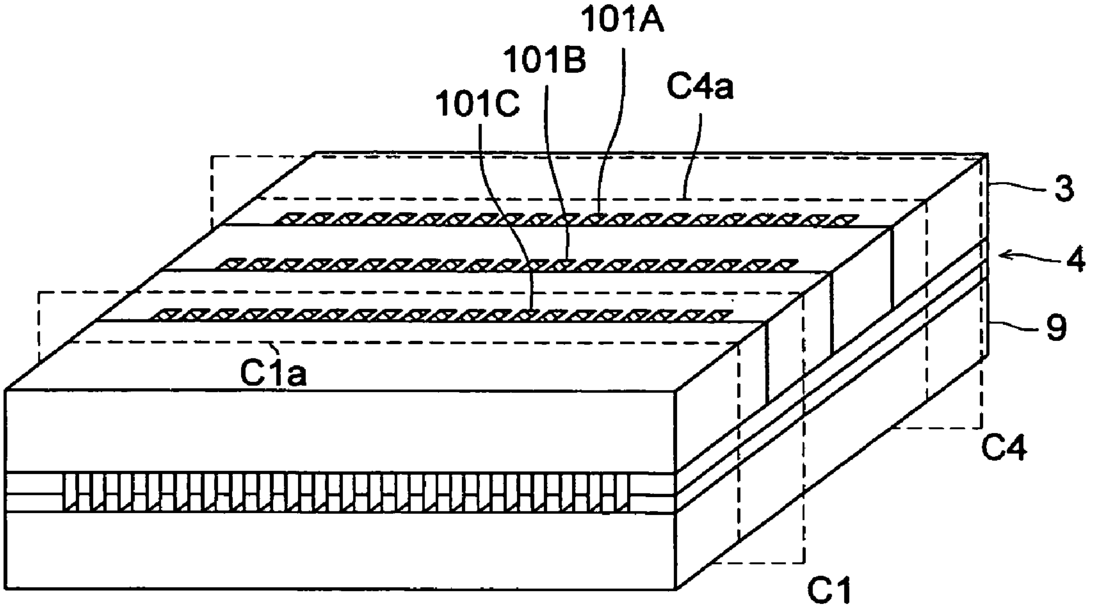
FIG. 28 is a perspective view showing an example in which a plurality of feedthrough electrode arrays are formed.

In the embodiment shown in FIG. 27, while the two sides of three segments are cut off, the portions not including feedthrough electrode 101 is wasted. Therfore, as shown in FIG. 28, it is desirable to form a plurality of arrays of feedthrough electrodes, and to cut out a plurality of harmonica type head chips. In the example shown in the figure, for example, in the case when three arrays of feedthrough electrodes 101A, 101B, and 101C are included, by cutting in the cutting planes C1 to C4, it is possible to obtain three harmonica type head chips. Further, in the figure, only the cutting planes C1 and C4 are shown, and the cutting planes C2 and C3 are omitted. In this figure, C1*a* and C4*a* are the cutting lines of the cutting planes C1 and C4.

Figure 29:
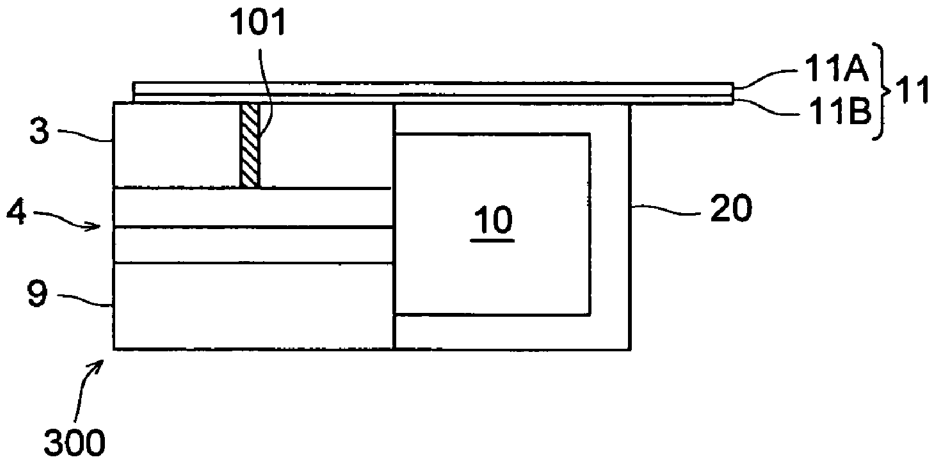
FIG. 29 is a cross-sectional view showing an example of the structure of an inkjet head.

Next, as another preferred embodiment of the present invention, such embodiment as shown in FIG. 29 is quoted. The embodiment shown in this figure is one in which an enclosure type manifold 20 are adhered to the back surface of harmonica type head chip 300 having a prescribed length manufactured as above, to form common ink chamber 10.

Flexible substrate 11 is provided on the top part of substrate 3 having feedthrough electrodes on which common ink chamber 10 is adhered on the back surface thereof. Flexible substrate 11 is composed of base material 11A made of, for example, polyimide etc., and electrodes 11B. the tip of the feedthrough electrode, and electrode 11B of flexible substrate 11 are connected so that they can conduct electricity. Therefore, if, for example, an IC drive circuit is operated, the drive signal is transmitted from electrodes 11B of flexible substrate 11 via feedthrough electrodes 101 to the electrodes on the driving walls.

The tip of feedthrough electrodes 101 (the top tip in the Fig.) can be in direct contact with flexible substrate 11, or can be connected electrically via an anisotropic conductive film or an anisotropic conductive paste etc. The anisotropic conductive film in which metal particles are dispersed in thermosetting plastic film and anisotropic conductive paste in which conductive particles are dispersed in an epoxy type resin can be used.

Further, although it is not shown in FIG. 29, a front cover is provided on the front surface of head chip 300 (the left side in the Fig.), and nozzles are provided for each channel.

Figure 30:
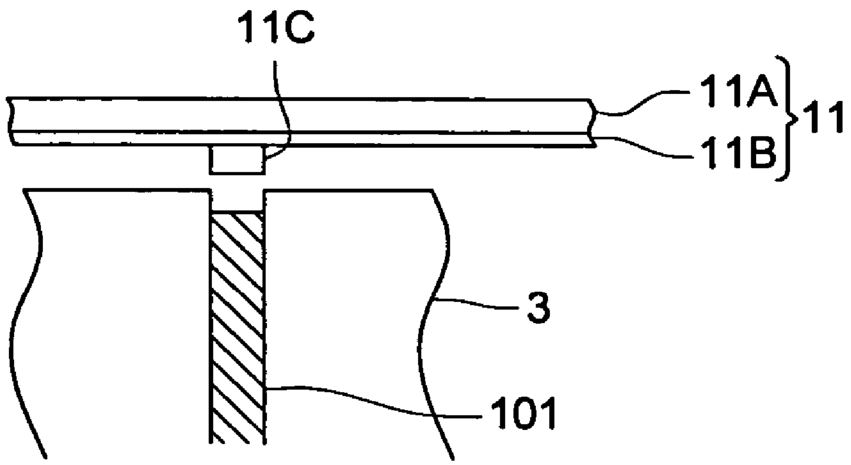
FIG. 30 is a partially enlarged cross-sectional view showing an example of the structure of an inkjet head.

Next, as another preferred embodiment of the present invention, such embodiment as shown in FIG. 30 is quoted. By using substrate 3 having a recess as shown in FIG. 19 and by providing bumps 11C on electrodes 11B of flexible substrate 11, position adjustment becomes easy, and also there is the effect that the connection is ensured. The method of providing the bumps 11C is not particularly restricted. Further, FIG. 30 shows a status before connecting.

Figure 31:
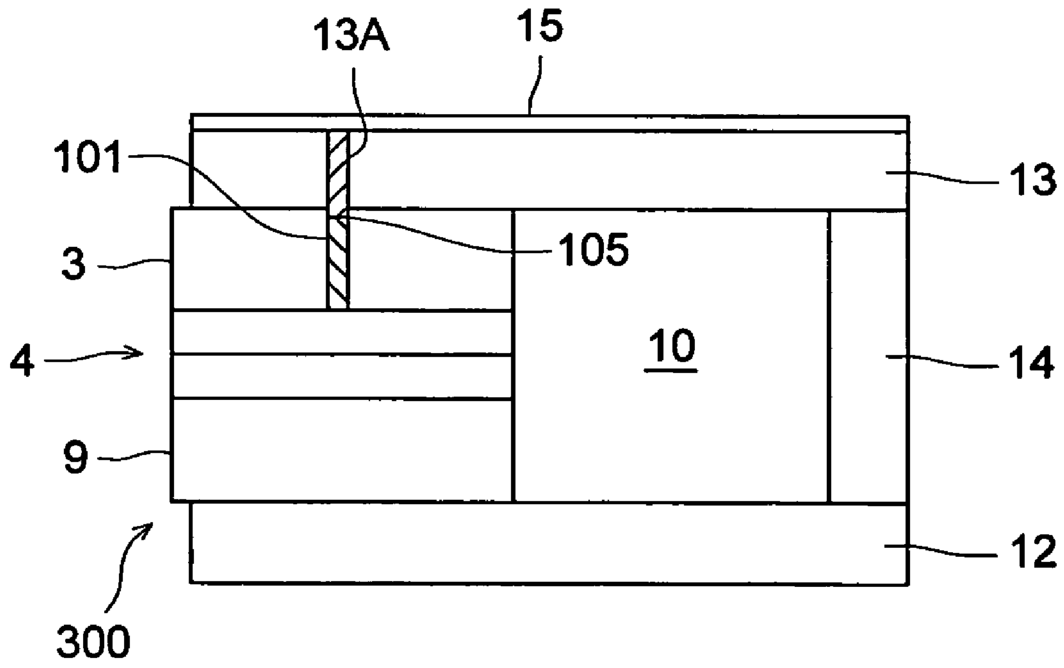
FIG. 31 is a cross-sectional view showing another example of the structure of an inkjet head.

Next, as another preferred embodiment of the present invention, an embodiment shown in FIG. 31 which is improvement of the embodiment shown in FIG. 29 is quoted.

In FIG. 31, for substrate 3 fixed on the upper part of head tip 300 (in drawing) having the same shape feedthrough electrodes, feedthrough electrodes 101 having recesses 105 at the top are used. Lower cover 12 is provided at lower parts of head tip 300 and extended backward (in Fig.). On substrate 3 having feedthrough electrodes, other substrate having feedthrough electrodes are adhered and extended backward.

The length of bottom cover 12 is adjusted so that the end of extended part of lower cover 12 and the end of extended part of substrate 13 having feedthrough electrodes are configured so that the both ends are positioned on a vertical plane by adjusting the lengths, and rear end cover 14 is adhered between the end of extended part of bottom cover 12 and the end of extended part of substrate 13 having feedthrough electrodes, and then common ink chamber 10 is formed on back surfaces (in the Fig.) of head chip 300 and substrate 3 having feedthrough electrodes by the end of extended part of lower cover 12, the end of extended part of substrate 13 having feedthrough electrodes, and rear end cover 14.

The feedthrough electrodes 13A of substrate 13 with feedthrough electrodes are projecting downwards in the Fig. (bumps have been formed), and are configured to inlay with the recesses 105 in feedthrough electrodes 101 of substrate 3 having feedthrough electrode. Because of this, position adjustment and firmness of connection are pledged.

Electrodes 15 are formed on the top surface of substrate 13 having feedthrough electrodes, by an usual method and these electrodes 15 are connected to be electrically conductive with feedthrough electrodes 13A of substrate 13 having feedthrough electrodes.

Further, in the above embodiment, the back end cover 14 is not restricted to the one shown in the Fig., but it can be adhered to the outer surfaces of the extended part of bottom cover 12 and the extended part of substrate 13 having feedthrough electrodes.

In addition, although it is not shown in FIG. 31, a front cover is provided at the front surface (left side in the Fig.) of head chip 300, and nozzles are provided to correspond to the channels.

In the present preferred embodiment, it is possible to have a larger common ink chamber than in the embodiment shown in FIG. 30, thereby the pressure loss of the flow path is suppressed when ink is ejected. In addition, since it is possible to make the adhering areas large which are between substrate 3 having feedthrough electrodes and substrate 13 having feedthrough electrodes, between cover substrate 9 and bottom cover 12 in FIG. 31, and between the adhering area between substrate 3 having feedthrough electrodes and manifold 20 in FIG. 29, it becomes easy to acquire the strength of adhesion, and also the manufacturing is easier.

Figure 32:
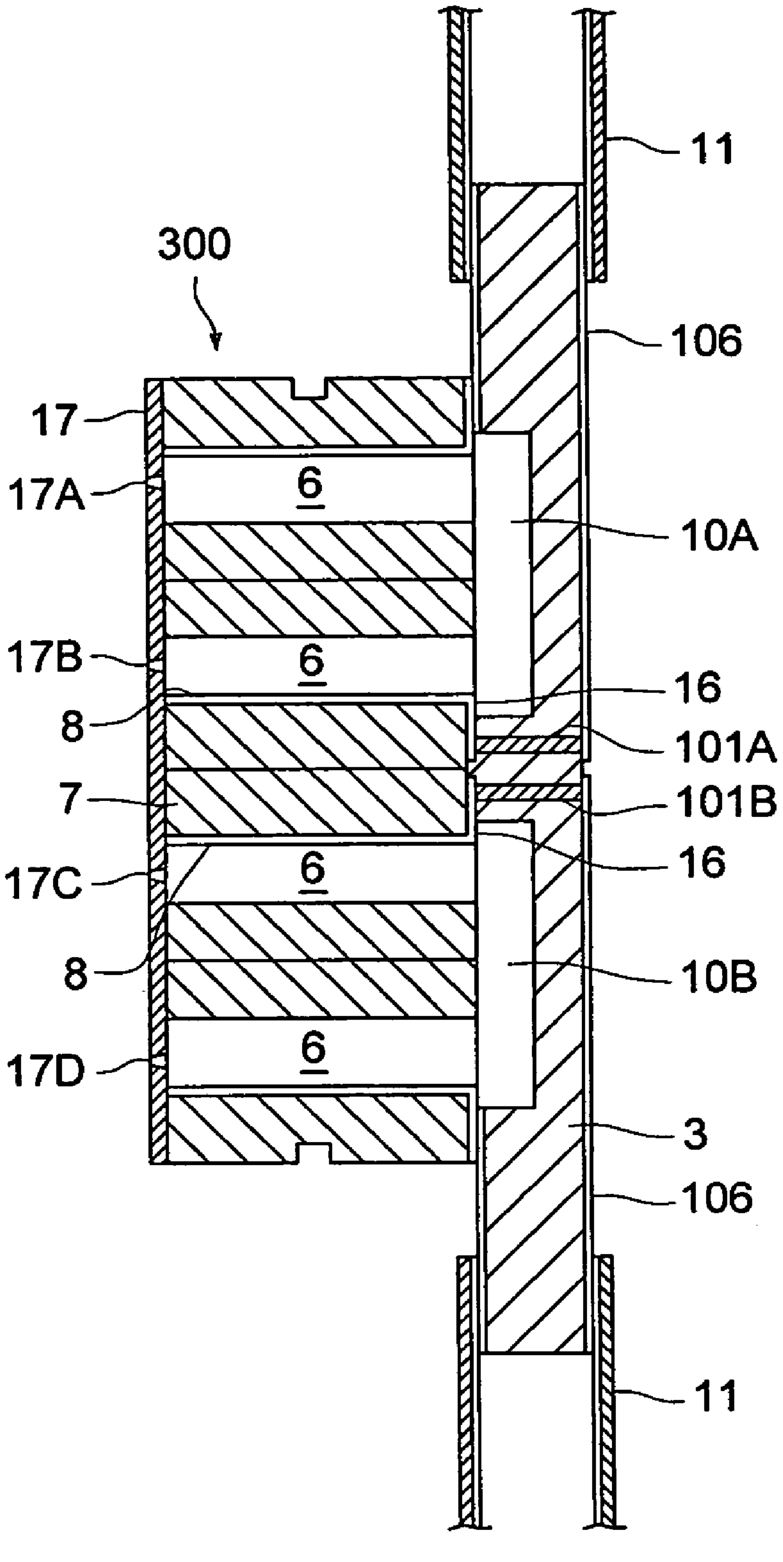
FIG. 32 is a cross-sectional view showing yet another example of the structure of an inkjet head.

Next, another preferred embodiment of the present invention is described referring to FIG. 32.

In the example shown in the Fig., this is a embodiment in which connection is made via the feedthrough electrodes to the drive electrodes of channel arrays positioned inside of the inkjet head having three or more arrays of channels.

In this embodiment, substrate 3 with feedthrough electrodes is adhered to the rear surface of head chip 300 (right side in the Fig.), common ink chambers 10A and 10B are provided separately for two arrays each corresponding to the four arrays of channels. These common ink chambers 10A and 10B are formed by machining substrate 3.

Feedthrough electrodes 101A and 101B are electrically in contact with the drive electrodes 8 formed on the inner surface of channels 6. Connection electrodes 16 are mediating to connect feedthrough electrodes 101A and 101B, and drive electrodes 8. It is possible to use, for example, the method disclosed in Japanese Unexamined Patent Application Open to Public Inspection No. 2005-14322 for the method of manufacturing the connection electrodes 16.

In case there are more than three arrays of channels, the electrical connections between the drive electrode of each channel of the channel array positioned inside and the input section that supplies the drive signals from the outside become difficult, thus it is possible to solve the problem by using a substrate having feedthrough electrodes such as the present invention. Meanwhile, although the number of channel arrays covered by one common ink chamber is one as FIG. 32 shows, it is also possible that the channel arrays can be covered individually one by one. In addition, by changing the color of ink supplied to each common ink chamber, it is possible to realize a head that can print in multiple colors with a single head.

For the electrical contact of feedthrough electrodes 101A and 101B on the side of the drive electrodes and on the opposite side, though not particularly restricted, for example, it is possible to adopt the embodiment shown in FIG. 21. In other words, a plurality of interconnections 106 connected to feedthrough electrode 101 are formed on the substrate 3 and the interconnections 106 are configured to be electrically connected to unillustrated drive circuits.

Further, in the embodiment shown in FIG. 32, the driving circuit is configured to be capable of electrical connections for the drive circuits, even for the drive electrodes in which the feedthrough electrodes do not intervene, as shown in the figure. In addition, a front cover 17 is provided on the front surface (left side in the Fig.) of head chip 300, and nozzles 17A, 17B, 17C, and 17D are provided corresponding to the four arrays of channels.

Figure 33:
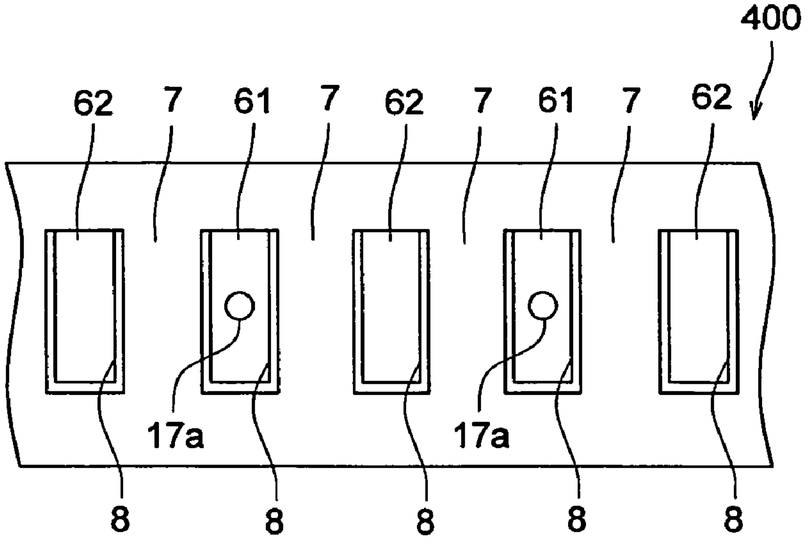
FIG. 33 is a cross-sectional view showing the structure of the channel part of an inkjet head of the independent drive type.

Furthermore, as in the inkjet head described above, in the case of a type inkjet head that ejects ink inside channel 6 by shear-deforming drive walls 7 in a V-shape, it is not possible for ink to be ejected from neighboring channels 6 at the same time. Therefore, as shown in FIG. 33, there is a case that an independent drive type inkjet head having head chip 400 in which ejecting channel 61 and non-ejecting channel 62 are alternatively allocated as shown in FIG. 33. A symbols 17*a* represents nozzles in FIG. 33.

In an independent drive type inkjet head of this type, although drive signals are applied independently according to the respective image data to the drive electrodes 8 within ejecting channels 61, since the common voltage (ground) is applied to drive electrodes 8 within vacant (non-ejecting) channels 62, it is possible to handle all the drive electrodes within all vacant channels 62 bundled together, and in this case, it is desirable to use particularly substrate 31 having feedthrough electrodes shown in FIG. 9, substrate 33 having feedthrough electrodes shown in FIG. 13, and substrate 34 with feedthrough electrodes shown in FIG. 15 as the substrate having feedthrough electrodes.

Figure 34:
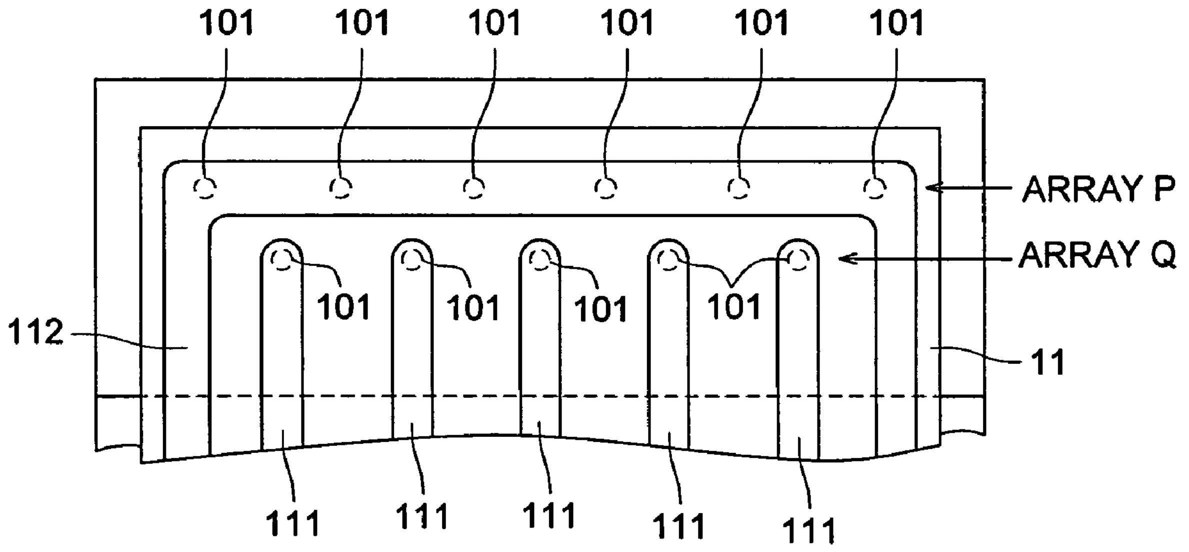
FIG. 34 is a plan view showing a part of an inkjet head of the independent drive type.

FIG. 34 is a diagram of the independent drive type inkjet head configured in a manner similar to that shown in FIG. 29 by using substrate 31 having feedthrough electrodes shown in FIG. 9, and is the view as seen from the side of that substrate 31 having feedthrough electrodes.

The substrate 31 having feedthrough electrodes, as shown in FIG. 9, metal wires are used for feedthrough electrodes 101, and a non-conducting area is formed between array P having metal wires in relatively shallow grooves 100*a* and the array Q having metal wires in relatively deep grooves 100*b*. Because of this, in one of the arrays, for example, if the feedthrough electrodes 101 in array P are connected electrically to the drive electrodes inside vacant channels, when the connection is made with the drive circuits by pressure bonding, flexible substrate 11 to the head chip, as shown in the Fig., it is possible to connect feedthrough electrodes 101 of array Q to individual interconnections 111 of flexible substrate 11, and to connect all feedthrough electrodes 101 of array P together to common interconnection wire 112 of the flexible substrate.

At this time, since the individual interconnections 111 of flexible substrate 11 have only to be made to correspond alternatively to every other feedthrough electrodes 101, even the channels are placed with a high density, it is not necessary to increase the density of independent interconnections 111 to that extent, and the formation of individual interconnections 111 becomes relatively easy.

In this substrate 31 having feedthrough electrodes, since the non-conductive area between array P row and array Q, as shown in FIG. 9, is formed by a difference in the depths of the relatively shallow grooves 101*a* and deep grooves 101*b*, it is possible to make the non-conductive area large, and it becomes easy to prevent short-circuiting between individual interconnections 111 and the common interconnections 112 by making this difference in depth large. In the case of substrate 33 and 34 having feedthrough electrodes, as shown respectively in FIG. 13 and FIG. 15, it is possible to make the non-conductive area between array P and array Q large, by making the depth of the grooves 100 large, When these substrates 31, 33, and 34 having feedthrough electrodes are used in an inkjet head of the independent drive type, it is not necessary to restrict to the above method of bundling the common electrodes together using a flexible substrate 11. As in FIG. 35, it is also possible to form patterns of interconnections beforehand on the substrates 31, 33, and 34 having feedthrough electrodes themselves.

Figure 35:
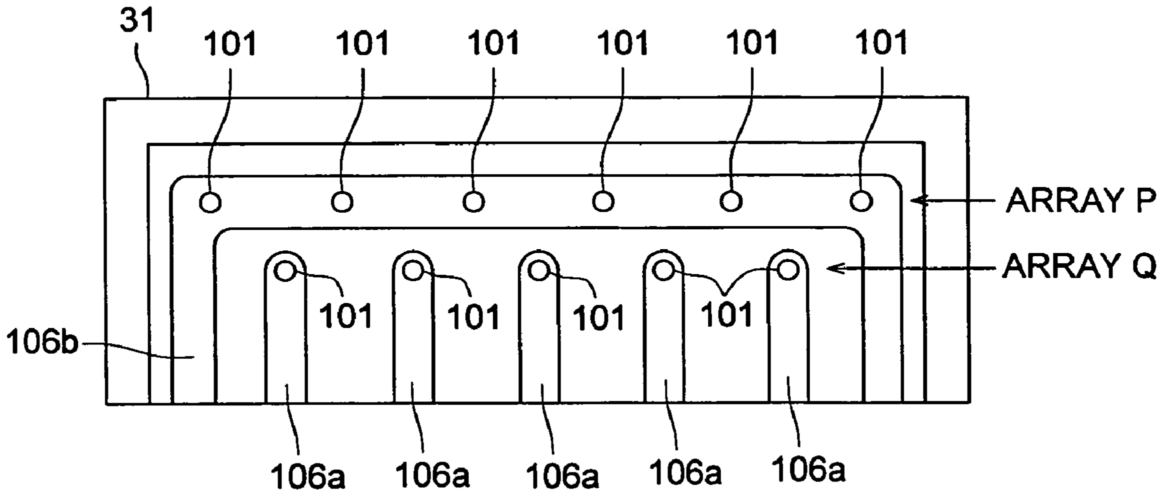
FIG. 35 is a plan view showing an example of a substrate having feedthrough electrodes ideally suitable for an inkjet head of the independent drive type.

In FIG. 35, patterns are formed for individual interconnections 106*a* respectively for each of feedthrough electrodes 101 of array Q in substrate 31 having feedthrough electrodes, and for each of feedthrough electrodes 101 of array P, the pattern formation of common interconnection 106*b* that collectively connects are formed. This can be applicable also to substrates 33, and 34 having feedthrough electrodes. The same method as in the case of FIG. 21 can be used for the method of forming of these individual interconnections 106*a* and the common interconnection 106*b*.

These substrates 31, 33, and 34 having feedthrough electrodes can be used desirably not only in inkjet heads of the independent drive type but also in inkjet heads in which all channels are made ejecting channels.

Figure 36:
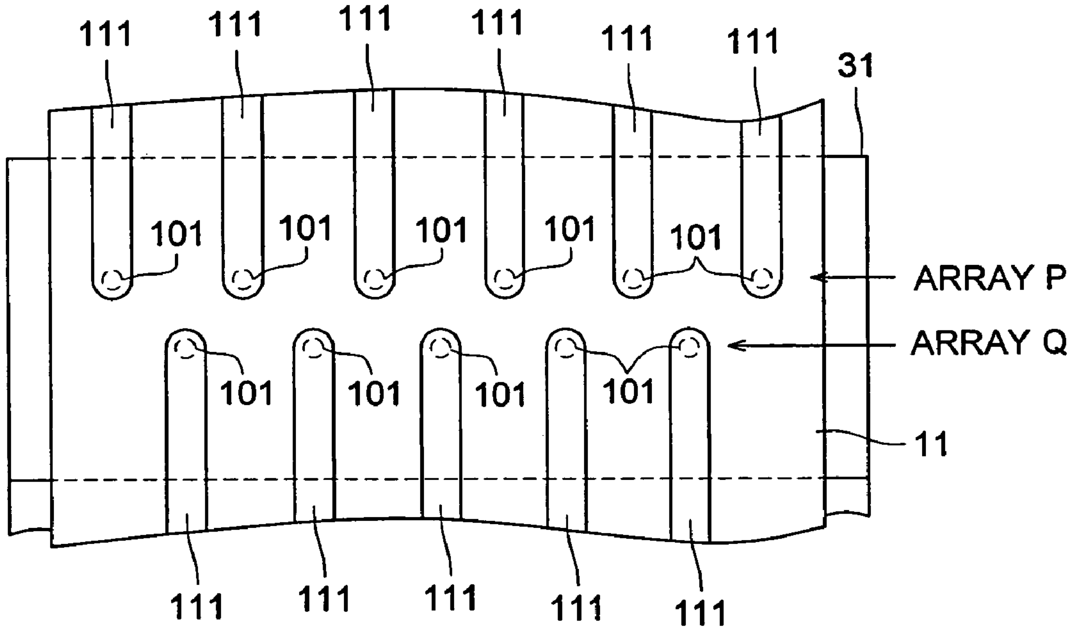
FIG. 36 is a plan view showing a part of another example of an inkjet head.

FIG. 36 is a diagram of an inkjet head having channels which are all ejecting channels, configured in a manner similar to that shown in FIG. 29, using substrate 31 having feedthrough electrodes shown in FIG. 9, and is a view as seen from the side of substrate 31 having feedthrough electrodes.

In this case, although individual interconnections 111 of flexible substrate 11 are connected to all feedthrough electrodes 101, interconnections 111 connected to feedthrough electrodes 101 of array P of substrate 31 having feedthrough electrodes and interconnections 111 connected to feedthrough electrodes 101 of array Q of substrate 31 having feedthrough electrodes are sorted so that they are taken out respectively in the opposite directions. In this method, since it is possible to halve the density of neighboring individual interconnections 111, formation of individual interconnections 111 is relatively easy, and the danger of short-circuiting between individual interconnections 111 can be lowered.

Figure 37:
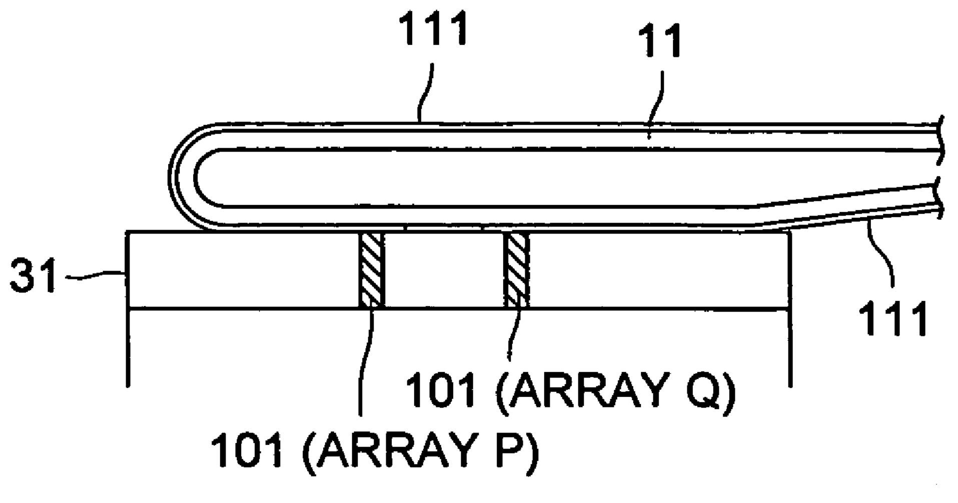
FIG. 37 is a cross-sectional view showing a part of the structure of the inkjet head showing in FIG. 36.

In flexible substrate 11, as shown in FIG. 37, it is possible to connect to the drive circuits on the same side by folding one edge towards the other edge.

According to the aforesaid preferred embodiments, it is possible to provide a method of manufacturing substrates having feedthrough electrodes for inkjet heads that are both low in cost and high in reliability and can be manufactured without using advanced manufacturing processes.

Further, by contracting directly the electrodes inside the channels from the rear side of the substrate, there is no need to pass the electrodes around to the front surface of the head, and hence it is possible to provide a method of manufacturing low cost and highly reliable inkjet heads.

In addition, according to the aforesaid preferred embodiments, in an inkjet head with more than three arrays of channels, it is possible to provide a method of manufacturing inkjet heads in which connection is made directly to the drive electrodes of the inner side arrays of channels.

What is claimed is:

1. A method of producing a substrate having feedthrough electrodes for an inkjet head, comprising:

a step of forming a plurality of parallel, straight grooves in a base, the base comprising a top side, a bottom side, a front side, a back side, a left side and a right side, the plurality of parallel, straight grooves formed in the top side and having a longitudinal direction perpendicular to the front side of the base;

a step of setting a conductive member fully located inside each of the grooves;

a step of filling each of the grooves to prevent communication through each of the grooves;

a step of adhering a cover onto the top side of the base to cover the filled grooves and form a covered structure;

a step of cutting the covered structure in parallel cutting planes which are perpendicular to the longitudinal direction of the grooves, the cutting planes spaced a predetermined width apart to form a plurality of substrates the substrate having feedthrough electrodes.

2. The method of claim 1, wherein in the step to form the grooves, every groove which is adjacent to one another in a direction from the left side to the right side is formed to have different depths and every other groove has the same depth.

3. The method of claim 1, wherein the conductive member is a metal wire.

4. The method of claim 3, wherein the relationship between a diameter A of the metal wire and a width of the groove is $A<a$.

5. The method of claim 1, wherein the conductive member is formed by a conductive paste.

6. The method of claim 1, wherein the conductive member is formed by electroplating.

7. The method of claim 1, wherein after forming the substrate having the feedthrough electrodes, bumps are formed on either both surfaces or one surface of the electrodes by electroplating.

8. The method of claim 1, wherein after forming the substrate having the feedthrough electrodes, either both surfaces or one surface of the electrodes is recessed by etching so that the surfaces of the electrodes are recessed below the surfaces of the substrate.

9. The method of claim 1, wherein after forming the substrate having the feedthrough electrodes, wires connected with the electrodes is formed.

* * * * *